(12) United States Patent
Ishino

(10) Patent No.: US 10,139,457 B2
(45) Date of Patent: Nov. 27, 2018

(54) DETECTION DEVICE AND MANUFACTURING METHOD THEREOF

(71) Applicant: DENSO CORPORATION, Kariya, Aichi-pref. (JP)

(72) Inventor: Hirotsugu Ishino, Kariya (JP)

(73) Assignee: DENSO CORPORATION, Kariya (JP)

( * ) Notice: Subject to any disclaimer, the term of this patent is extended or adjusted under 35 U.S.C. 154(b) by 170 days.

(21) Appl. No.: 15/504,812

(22) PCT Filed: Aug. 19, 2015

(86) PCT No.: PCT/JP2015/004123
§ 371 (c)(1),
(2) Date: Feb. 17, 2017

(87) PCT Pub. No.: WO2016/035270
PCT Pub. Date: Mar. 10, 2016

(65) Prior Publication Data
US 2017/0254862 A1 Sep. 7, 2017

(30) Foreign Application Priority Data
Sep. 2, 2014 (JP) ................................. 2014-177959

(51) Int. Cl.
*G01R 33/06* (2006.01)
*G01R 33/00* (2006.01)
*G01D 5/22* (2006.01)

(52) U.S. Cl.
CPC .......... *G01R 33/06* (2013.01); *G01D 5/2208* (2013.01); *G01R 33/0052* (2013.01)

(58) Field of Classification Search
None
See application file for complete search history.

(56) References Cited

U.S. PATENT DOCUMENTS 4,358,691 A * 11/1982 Naylor .................. H01F 7/1615
310/12.04

FOREIGN PATENT DOCUMENTS

| DE | 10 2010 061 955 | 3/2014 |
|----|----|----|
| FR | 2 288 313 | 5/1976 |
| JP | 2015-152473 | 8/2015 |

* cited by examiner

*Primary Examiner* — Paresh H Patel
(74) *Attorney, Agent, or Firm* — Nixon & Vanderhye PC

(57) ABSTRACT

A dielectric member includes a first bobbin, which is located on a radially outer side of a first core, a holder, which receives a magnet, and a second bobbin, which is located on a radially outer side of a second core. A first terminal and a second terminal are fixed to a terminal fixing portion. A wire continuously forms a first connecting portion, which is connected to the first terminal, a first coil portion, which is wound around the first bobbin, a first crossover portion, which traverses from the first coil to the second bobbin over the holder, a second coil portion, which is wound around the second bobbin, a second crossover portion, which traverses from the second coil portion to the first coil portion over the holder, and a second connecting portion, which is connected to the second terminal.

15 Claims, 21 Drawing Sheets

DETECTION DEVICE AND MANUFACTURING METHOD THEREOF

CROSS REFERENCE TO RELATED APPLICATION

This application is the U.S. national phase of International Application No. PCT/JP2015/004123 filed on Aug. 19, 2015 and is based on and incorporates herein by reference Japanese Patent Application No. 2014-177959 filed on Sep. 2, 2014.

TECHNICAL FIELD

The present disclosure relates to a detection device and a manufacturing method thereof.

BACKGROUND ART

There is known a detection device that detects a detection subject without contacting the detection subject.

The detection device, which is disclosed in the patent literature 1, includes a first coil and a second coil, which are placed on one side and the other side, respectively, of the magnet. A winding direction of the first coil and a winding direction of the second coil are opposite to each other. Furthermore, a wire, which forms the first coil, and a wire, which forms the second coil, are connected in series. Thereby, when a disturbance magnetic field is applied to the detection device, an electromotive force, which is generated in the first coil, and an electromotive force, which is generated in the second coil, are canceled with each other. Thereby, when the detection subject passes around the first coil, the detection device can detect an induced electromotive force, which is generated in the first coil, without being influenced by the disturbance magnetic fields.

However, in the patent literature 1, there is no disclosure with respect to a manufacturing method for winding the wire around a core. If the first coil and the second coil are separately formed and are thereafter joined together at a joint between the wire of the first coil and the wire of the second coil, these wires may possibly be broken at the joint at the time of applying a tension to the wires. Also, a manufacturing process of joining the wire of the first coil and the wire of the second coil together may possibly be complicated.

CITATION LIST

Patent Literature

Patent Literature 1: DE102010061955B4

SUMMARY OF THE INVENTION

The present disclosure is made in view of the above disadvantages. Thus, it is an objective of the present disclosure to provide a detection device and a manufacturing method thereof, which can improve a reliability of the detection device and can simplify manufacturing of the detection device.

A detection device according to a first aspect of the present disclosure includes a magnet, a first core, a second core, a dielectric member, a terminal fixing portion, a first terminal, a second terminal and a wire. The first core is located on one side of the magnet where one magnetic pole of the magnet is placed. The second core is located on another side of the magnet where another magnetic pole of the magnet is placed. The dielectric member includes: a first bobbin, which is located on a radially outer side of the first core; a holder, which receives the magnet; and a second bobbin, which is located on a radially outer side of the second core. The first terminal and the second terminal are fixed to the terminal fixing portion that is located on a side of the first bobbin, which is opposite from the magnet. The wire continuously forms: a first connecting portion, which is connected to the first terminal; a first coil portion, which extends from the first connecting portion and is wound around the first bobbin; a first crossover portion, which extends from the first coil portion to the second bobbin across the holder; a second coil portion, which extends from the first crossover portion and is wound around the second bobbin in a winding direction, which is opposite from a winding direction of the first coil portion; a second crossover portion, which extends from the second coil portion to the first coil portion across the holder; and a second connecting portion, which extends from the second crossover portion and is connected to the second terminal.

Thereby, the process of forming the first coil portion and the second coil portion at the first bobbin and the second bobbin, respectively, with the wire connected to the first terminal and the subsequent process of connecting the wire to the second terminal can be executed in a single step. Therefore, since a joint is not formed between the first coil portion and the second coil portion in the detection device, it is possible to reduce a possibility of breaking the wire and thereby to improve the reliability of the detection device. Furthermore, the detection device can simplify the manufacturing process of winding the wire.

According to a second aspect of the present disclosure, a manufacturing method of the detection device is provided. According to this manufacturing method, one end of the wire is connected to the first terminal, and thereafter, the first coil portion is formed by winding the wire around the first bobbin. Then, the wire is moved to the second bobbin through the holder, and the second coil portion is formed by winding the wire around the second bobbin. Thereafter, the wire is moved to the second terminal side through the holder once again, and another end of the wire is connected to the second terminal.

In this way, according to the second aspect of the present disclosure, the effects and the advantages, which are similar to those of the first aspect discussed above can be achieved.

According to a third aspect of the present disclosure, another manufacturing method of the detection device is provided. According to this manufacturing method, the first coil portion is formed while contacting the wire to a first adjusting member located between the first terminal and the first coil portion, and the second connecting portion is formed while contacting the wire to a second adjusting member located between the second terminal and the first coil portion. Once the second connecting portion is formed, the first adjusting member and the wire are disconnected from each other, and the second adjusting member and the wire are disconnected from each other.

In this way, even if the thermal expansion coefficient of the dielectric member and the thermal expansion coefficient of the wire are substantially different from each other, the possibility of disconnecting the wire caused by, for example, the thermal shock, can be reduced.

DESCRIPTION OF EMBODIMENTS

Various embodiments of the present disclosure will be described with reference to the drawings.

First Embodiment

A first embodiment of the present disclosure will be described with reference to FIGS. 1 to 8. A detection device 1 of the first embodiment detects movement of a detection subject made of a non-magnetic electric conductive material. The detection subject may be, for example, turbine blades (hereinafter, referred to as blades) 2 of a supercharger of an engine (see FIGS. 3 and 4). The blades 2 are made of, for example, aluminum or titanium and are respectively shaped into a thin plate form. The detection device 1 is placed without contacting the blades 2 and outputs a signal that corresponds to a rotational speed of the blades 2.

Figure 1:
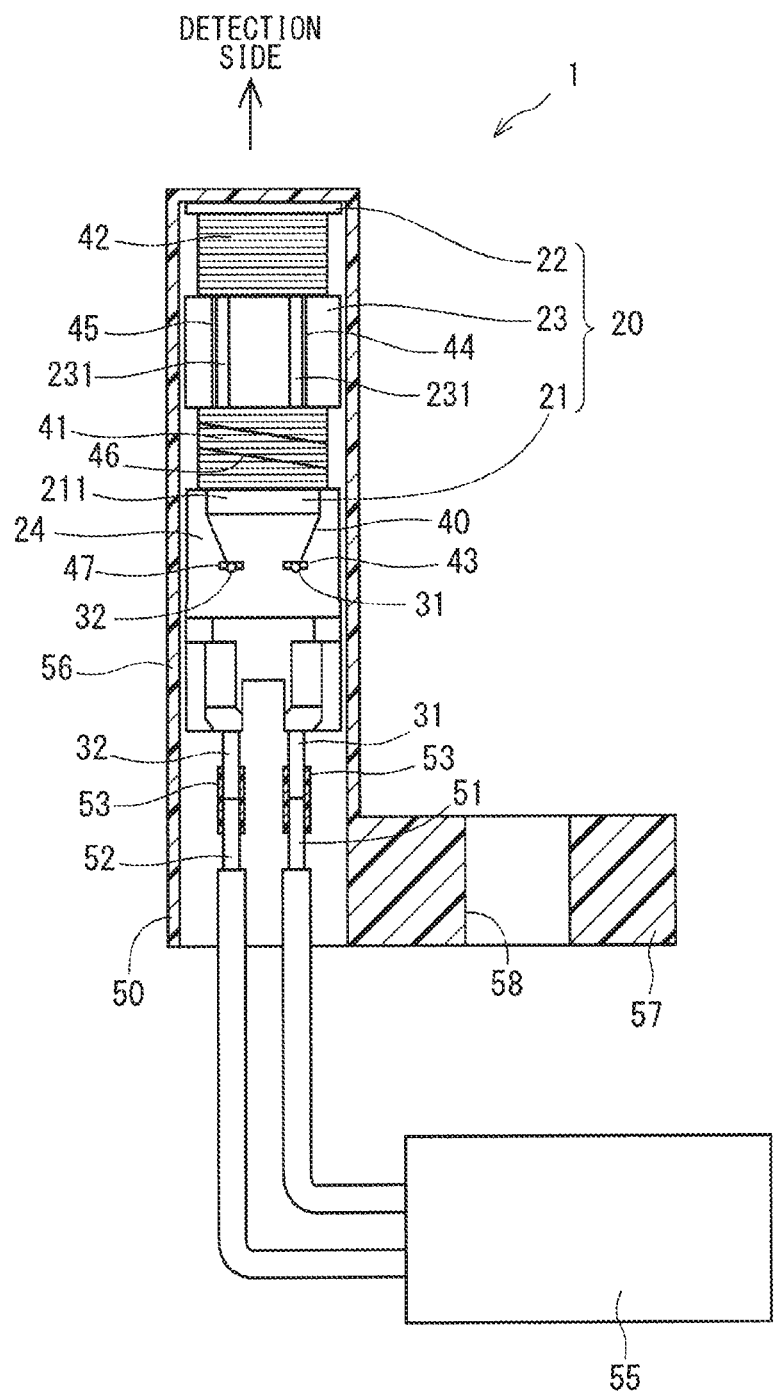
FIG. 1 is a partial cross sectional view of a detection device according to a first embodiment of the present disclosure.
Figure 2:
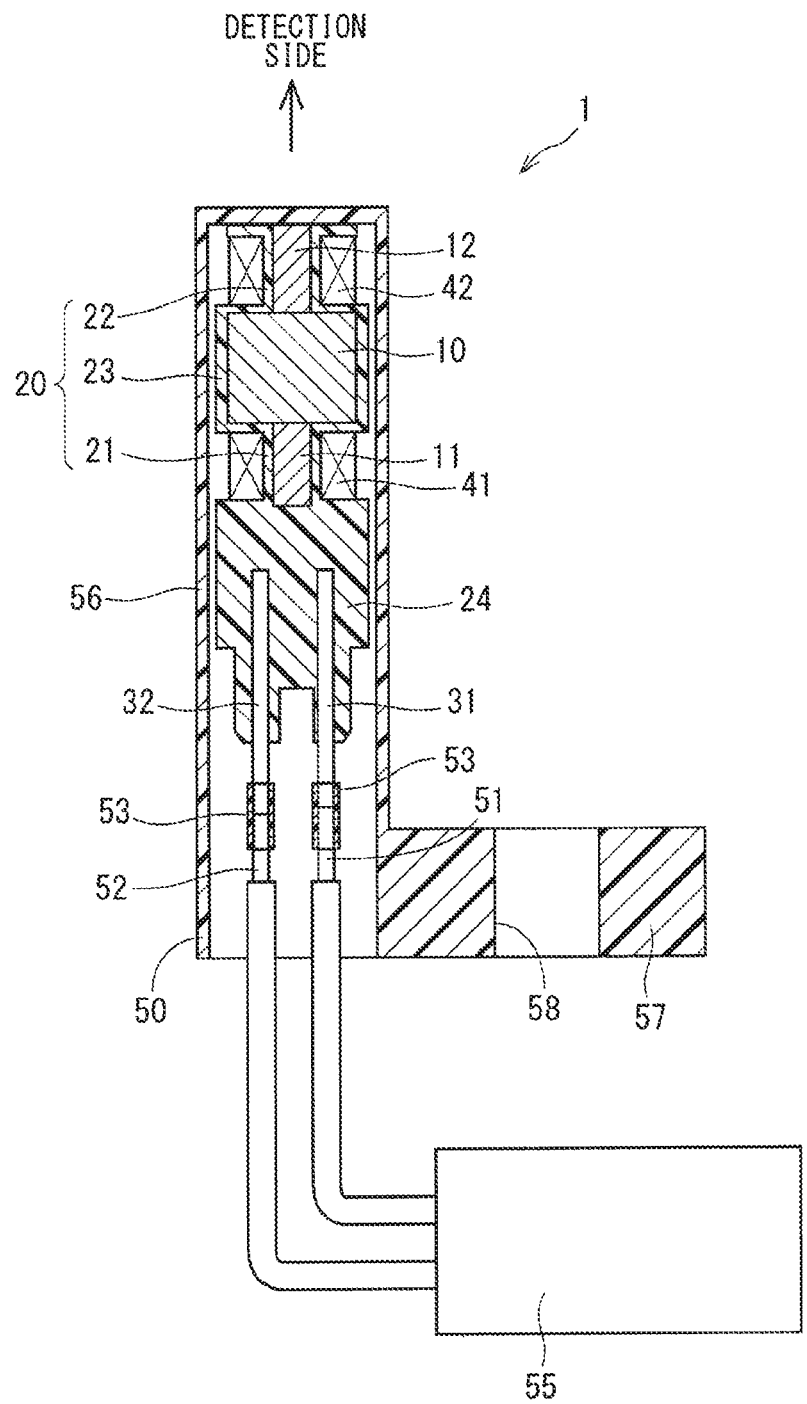
FIG. 2 is a cross sectional view of the detection device of the first embodiment.

As shown in FIGS. 1 and 2, the detection device 1 includes a magnet (permanent magnet) 10, a first core 11, a second core 12, a dielectric member 20, a terminal fixing portion 24, a first terminal 31, a second terminal 32, a wire 40 and a case 50. In the following discussion, a side, at which the detection device 1 is opposed to the detection subject, will be referred to as a detection side.

The first core 11 is placed at one side of the magnet 10 where one of two magnetic poles of the magnet 10 is placed. The second core 12 is placed at the other side of the magnet 10 where the other one the magnetic poles of the magnet 10 is placed.

In the present embodiment, although it is described that the second core 12 is placed at the detection side of the magnet 10, the first core 11 and the second core 12 have the identical specification, such as a material, an outer diameter, a length. Furthermore, the magnet 10, the first core 11 and the second core 12 are shaped into a cylindrical form or a prism form and are coaxially arranged.

The first core 11 and the second core 12 are made of a magnetic material, such as iron. The magnet 10 can exert a static magnetic field through the second core 12 at a location, through which the detection subject passes.

The dielectric member 20 and the terminal fixing portion 24 are made of, for example, resin. The dielectric member 20 includes a first bobbin 21, a holder 23 and a second bobbin 22. The first bobbin 21 is placed on a radially outer side of the first core 11. The holder 23 receives the magnet 10. The second bobbin 22 is placed on a radially outer side of the second core 12. The first bobbin 21, the holder 23, the second bobbin 22 and the terminal fixing portion 24 may be integrally and seamlessly formed as a one-piece body through injection molding or may be formed as separate members and joined together.

The first bobbin 21 receives the first core 11 therein. The holder 23 receives the magnet 10 therein. The second bobbin 22 receives the second core 12 therein.

Figure 6:
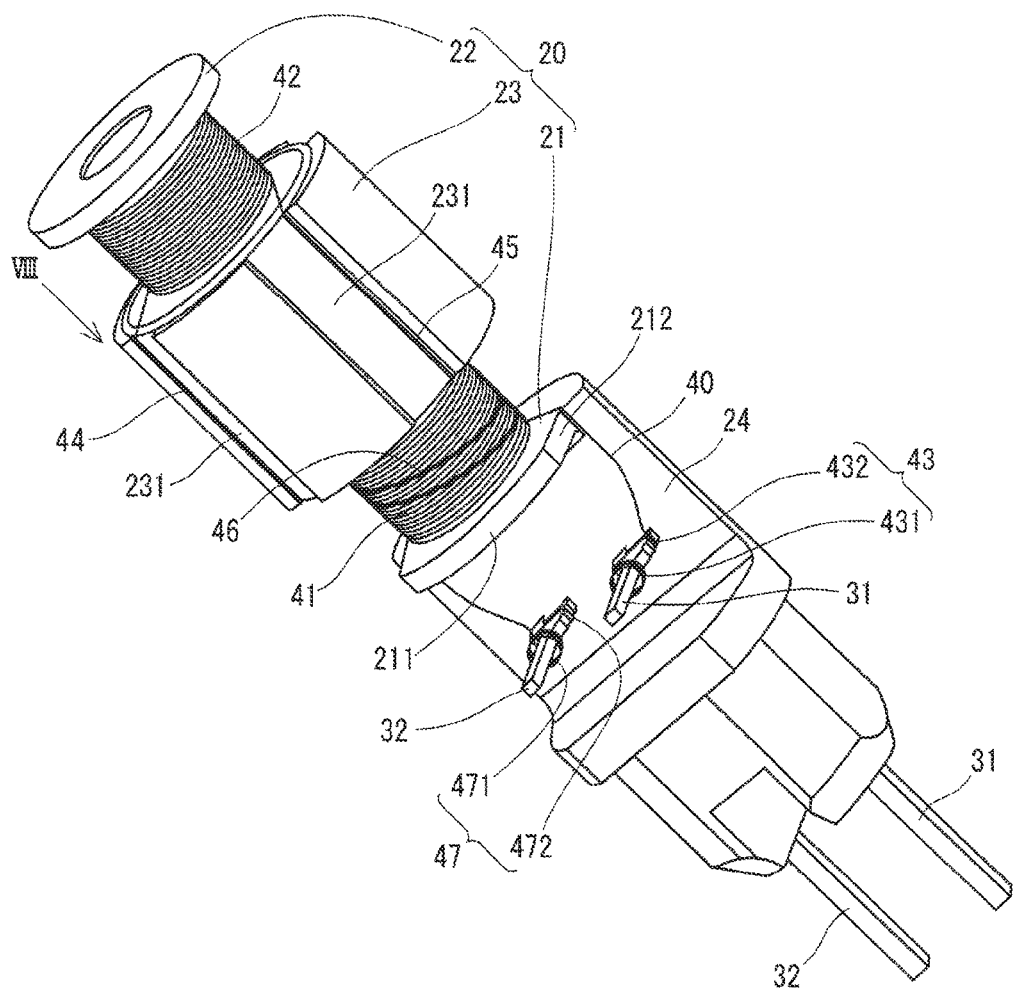
FIG. 6 is a perspective view showing characteristic parts of the detection device of the first embodiment.
Figure 7:
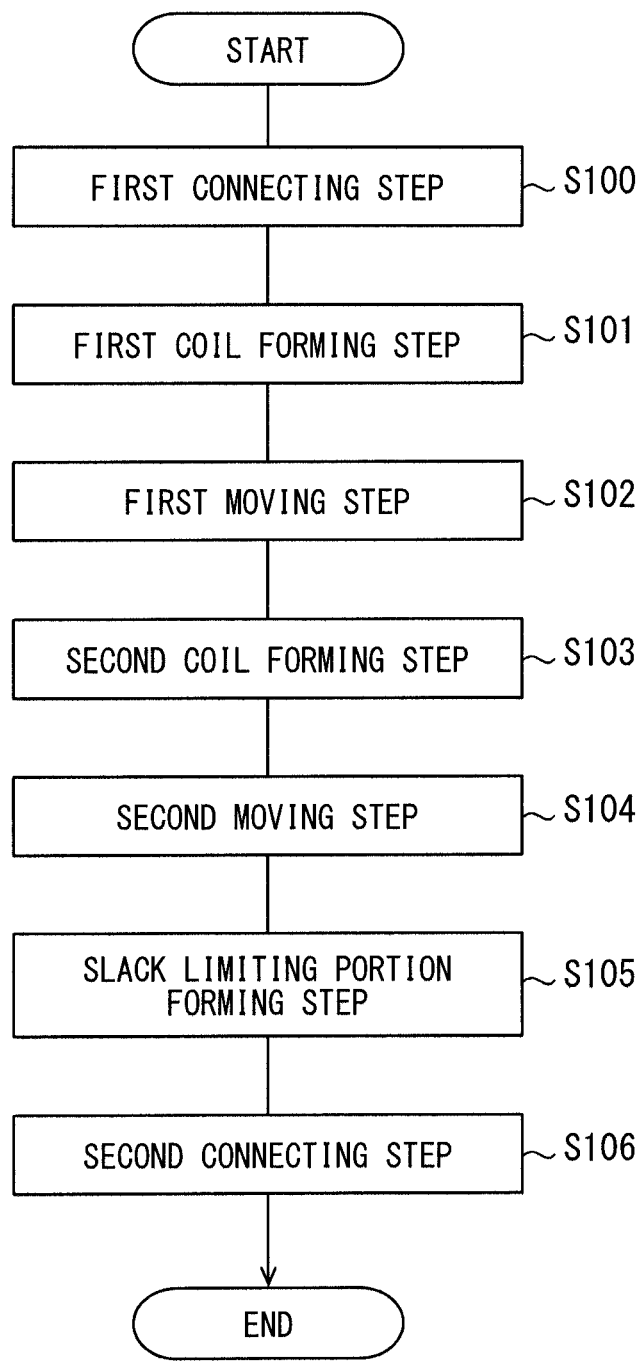
FIG. 7 is a flowchart indicating a manufacturing process of the detection device of the first embodiment.

With reference to FIG. 6, a flange 211 of the first bobbin 21 is placed on the terminal fixing portion 24 side, and a notched surface 212 is formed at the flange 211. A tension can be applied to the wire 40 by contacting the wire 40 against a corner between the notched surface 212 and the terminal fixing portion 24.

The holder 23 includes a plurality (two in this example) of recessed grooves 231. A tension can be applied to the wire 40 by contacting the wire 40 against a wall of a corresponding one of the recessed grooves 231.

The terminal fixing portion 24 is placed on an opposite side of the first bobbin 21, which is opposite from the magnet 10. The first terminal 31 and the second terminal 32 are securely held by the terminal fixing portion 24 through a process of resin molding. The first terminal 31 and the second terminal 32 are placed to be parallel to each other and project from the terminal fixing portion 24 in a perpendicular direction that is perpendicular to a direction, along which the magnetic poles of the magnet 10 are placed one after another (a direction, along which the one magnetic pole and the other magnetic pole are placed one after another). A surface of the terminal fixing portion 24, from which the first terminal 31 and the second terminal 32 project, is located on a radially inner side of an outer peripheral edge of the flange 211 of the first bobbin 21. The first terminal 31 and the second terminal 32 project from the terminal fixing portion 24 at a location, which is on a radially inner side of the notched surface 212 of the flange 211 of the first bobbin 21.

One end of the wire 40 is connected to the first terminal 31, and the wire 40 forms a first coil portion 41 and a second coil portion 42 at the outer side of the first bobbin 21 and the outer side of the second bobbin 22, respectively. The other end of the wire 40 is connected to the second terminal 32.

Figure 3:
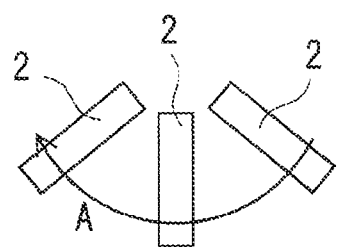
FIG. 3 is a schematic diagram of the detection device of the first embodiment.
Figure 3:
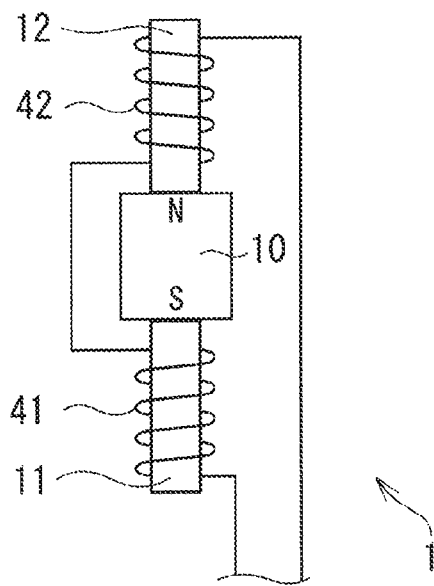

With reference to FIG. 3, the number of turns of the wire 40 in the first coil portion 41 and the number of turns of the wire 40 in the second coil portion 42 are equal to each other. However, a winding direction of the wire 40 in the first coil portion 41 and a winding direction of the wire 40 in the second coil portion 42 are opposite to each other.

With reference to FIG. 6, a portion of the wire 40, which is connected to the first terminal 31, will be referred to as a first connecting portion 43. A portion of the wire 40, which is wound around the first bobbin 21, will be referred to as a first coil portion 41. A portion of the wire 40, which extends from the first coil portion 41 to the second bobbin 22 across the holder 23, will be referred to as a first crossover portion 44. A portion of the wire 40, which is wound around the second bobbin 22, will be referred to as a second coil portion 42. A portion of the wire 40, which extends from the second coil portion 42 to the first coil portion 41 across the holder 23, will be referred to as a second crossover portion 45. A portion of the wire 40, which is wound around an outer side of the first coil portion 41, will be referred to as a slack limiting portion 46. A portion of the wire 40, which is connected to the second terminal 32, will be referred to as a second connecting portion 47.

The first connecting portion 43, the first coil portion 41, the first crossover portion 44, the second coil portion 42, the second crossover portion 45, the slack limiting portion 46 and the second connecting portion 47 are formed by the single continuous wire 40 without forming any joint in the wire 40.

The first crossover portion 44 connects a part of the wire 40 of the first coil portion 41, which is wound at the holder 23 side, to a part of the wire 40 of the second coil portion 42, which is wound at the holder 23 side.

The second crossover portion 45 connects a part of the wire 40 of the second coil portion 42, which is wound at the holder 23 side, to a part of the wire 40 of the slack limiting portion 46, which is wound at the holder 23 side.

The slack limiting portion 46 is wound at least one turn around the outer side of the first coil portion 41 at a location between the second crossover portion 45 and the second connecting portion 47. Here, it is desirable that the slack limiting portion 46 is wound around the outer side of the first coil portion 41 for one to five turns or ten turns to such an extent that the wire 40 is not loosened at the outside of the first coil portion 41. It should be noted that the slack limiting portion 46 may be eliminated in a case where the wire 40 is not loosened at the outside of the first coil portion 41. Furthermore, it is desirable that the winding direction of the wire 40 in the slack limiting portion 46 is the same as the winding direction of the wire 40 in the first coil portion 41. In such a case, a direction of the magnetic field generated in the slack limiting portion 46 and a direction of the magnetic field generated in the first coil portion 41 are identical to each other. Thereby, the slack limiting portion 46 can limit the loosening of the wire 40 in the first coil portion 41 without interfering the function of the first coil portion 41.

The first connecting portion 43 of the wire 40 includes a first fixing part 431 and a first dead turn part 432. The first fixing part 431 is fixed to the first terminal 31 by welding or soldering. The first dead turn part 432 is wound around the first terminal 31 on the terminal fixing portion 24 side of the first fixing part 431. The second connecting portion 47 of the wire 40 includes a second fixing part 471 and a second dead turn part 472. The second fixing part 471 is fixed to the second terminal 32 by welding or soldering. The second dead turn part 472 is wound around the second terminal 32 on the terminal fixing portion 24 side of the second fixing part 471.

Figure 19:
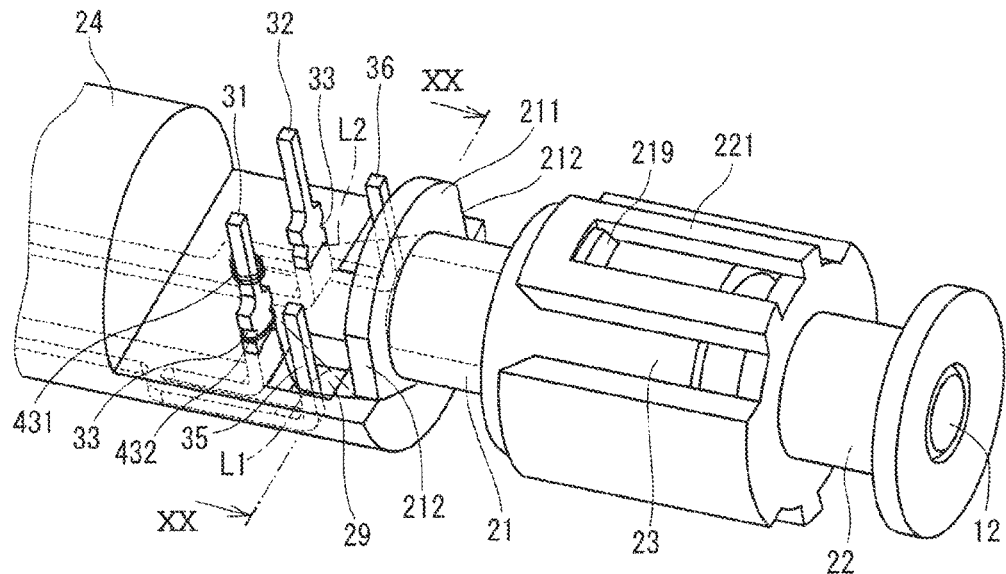
FIG. 19 is a perspective view showing characteristic parts of a detection device according to a sixth embodiment of the present disclosure.

The first terminal 31 includes a recessed part 33, around which the first dead turn part 432 is wound (see FIG. 19). The wire 40 is welded to the first terminal 31 at a location, which is on a distal end side of the recessed part 33 where a distal end part of the first terminal 31 is placed, so that the first fixing part 431 is formed. The wire 40 is extended from the first fixing part 431 and is wound around the recessed part 33 to form the first dead turn part 432.

The first fixing part 431 is formed by, for example, generating an electric arc at the distal end part of the first terminal 31. Alternatively, the first fixing part 431 may be formed by soldering the wire 40 to the first terminal 31.

Since the first dead turn part 432 is wound around the recessed part 33, positional deviation of the first dead turn part 432 from the recessed part 33 in the axial direction of the first terminal 31 is limited.

The second terminal 32 as well as the second fixing part 471 and the second dead turn part 472 formed at the second terminal 32 are arranged in a manner similar to that of the first terminal 31 as well as the first fixing part 431 and the first dead turn part 432 formed at the first terminal 31.

As shown in FIGS. 1 and 2, an end part of the first terminal 31 and an end part of the second terminal 32, which are opposite from the side where the first fixing part 431 and the second fixing part 471 are formed, project from the terminal fixing portion 24 and are connected to two wire cables 51, 52, respectively. The wire cable 51 and the first terminal 31 are fixed together through, for example, swaging of a tube 53 against the wire cable 51 and the first terminal 31. Alternatively, the wire cable 51 and the first terminal 31 may be fixed together by, for example, welding.

The other wire cable 52 and the second terminal 32 may be arranged in a manner similar to the wire cable 51 and the first terminal 31 discussed above.

The two wire cables are connected to a connector 55. The detection device 1 outputs a voltage signal from the connector 55.

The case 50 includes a case main body 56 and an installing portion 57. The case main body 56 is shaped into a tubular form having a bottom. The installing portion 57 projects from the case main body 56. The case 50 is made of a non-magnetic metal or resin. The case main body 56 receives the magnet 10, the first core 11, the second core 12, the dielectric member 20, the terminal fixing portion 24, the first terminal 31, the second terminal 32 and the wire 40, which are described above. The members, which are received in an inside of the case main body 56, are secured when a potting material is filled in an inside of the case 50.

A bolt hole 58 is formed in the installing portion 57. A bolt (not shown) is inserted into the bolt hole 58, so that the detection device 1 is fixed to, for example, a housing (not shown), to which the blades (serving as the detection subject) 2 are installed.

Next, a method of detecting a rotational speed of the blades 2 will be described.

Figure 4:
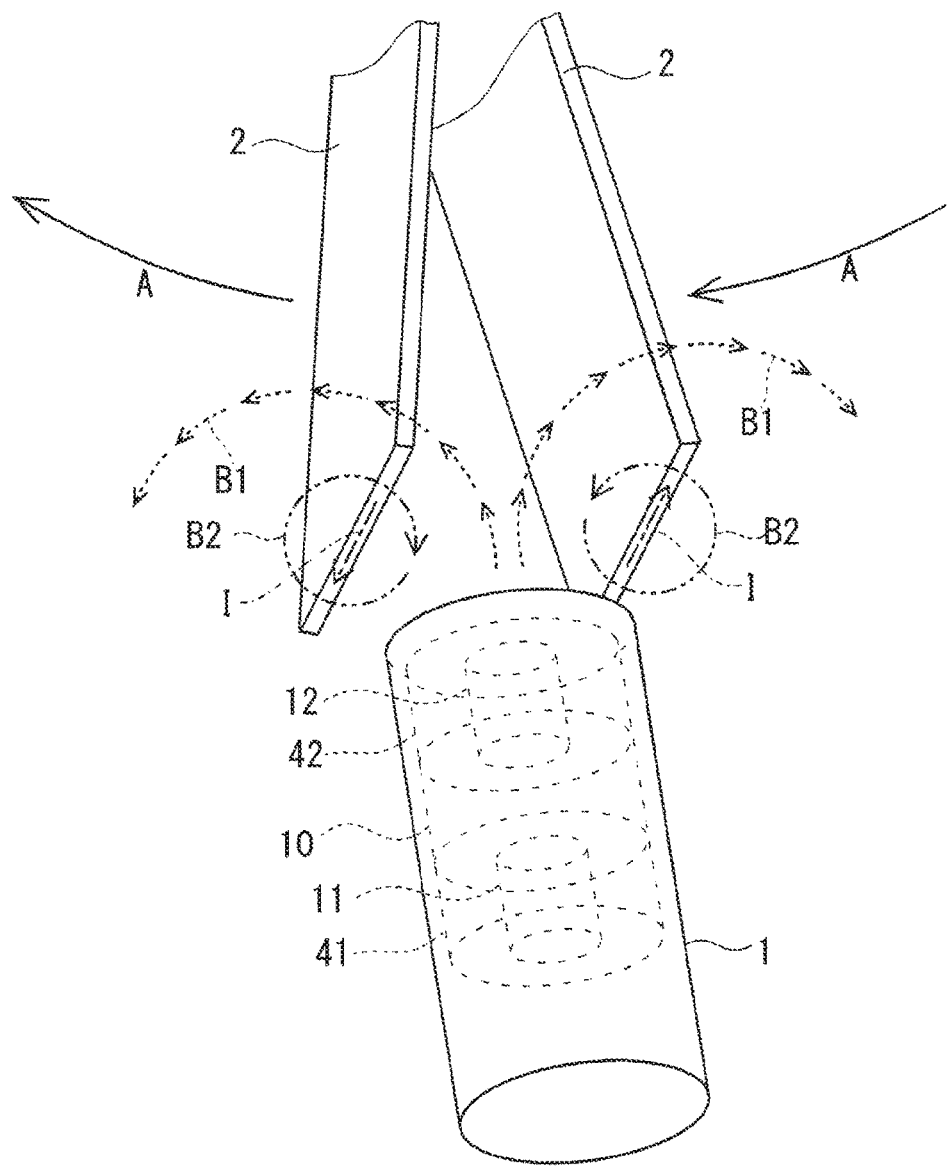
FIG. 4 is a descriptive diagram indicating a magnetic field of a magnet and a magnetic field induced by an eddy current that flows in a detection subject.

In FIG. 4, a magnetic field of the magnet 10 is indicated by a dotted line B1, and an eddy current, which flows in each corresponding blade 2 is indicated by a dot-dash line I. Furthermore, a magnetic field, which is induced by the eddy current, will be indicated by a dot-dot-dash line B2. The blades 2 are rotated in a direction of an arrow A.

When each blade 2 is moved within an extent of the magnetic field B1 of the magnet 10, an electromotive force is generated in the blade 2 in such a manner that the electromotive force generates the magnetic field B2 in a direction for counteracting against a change in the magnetic field B1 that penetrates through the blade 2. Thereby, the eddy current I flows in the blade 2. A magnetic flux, which flows in the second core 12, is changed by the magnetic field B2 that is induced by the eddy current I. Thereby, an induced electromotive force is generated in the second coil portion 42.

The strength of the magnetic field is inversely proportional to a square of a distance between the objects. Therefore, the magnetic flux, which flows through the first core 11 provided on the opposite side of the magnet 10 that is opposite from the second core 12, does not substantially change. Therefore, the detection device 1 can detect the rotation of the blades 2 by detecting a voltage between the first terminal 31 and the second terminal 32, which are connected to the first coil portion 41 and the second coil portion 42, respectively.

Next, there will be described a case where a disturbance magnetic field (noise) is applied from, for example, a road heater or a power transmission line.

When the disturbance magnetic field is simultaneously applied to both of the first coil portion 41 and the second coil portion 42, the magnetic flux, which flows through the first core 11, and the magnetic flux, which flows through the second core 12, are simultaneously changed in response to a change in the magnetic field B1 of the magnet 10. Thereby, an electromotive force is generated in both of the first coil portion 41 and second coil portion 42. Since the winding direction of first coil portion 41 and the winding direction of second coil portion 42 are opposite to each other, a direction of the electromotive force generated in the first coil portion 41 is opposite to a direction of the electromotive force generated in the second coil portion 42. Thus, the output of the first coil portion 41 and the output of the second coil portion 42 are canceled with each other. Thereby, the detection device 1 can highly accurately detect the movement of the blades 2 without being influenced by the disturbance magnetic field.

Figure 5A:
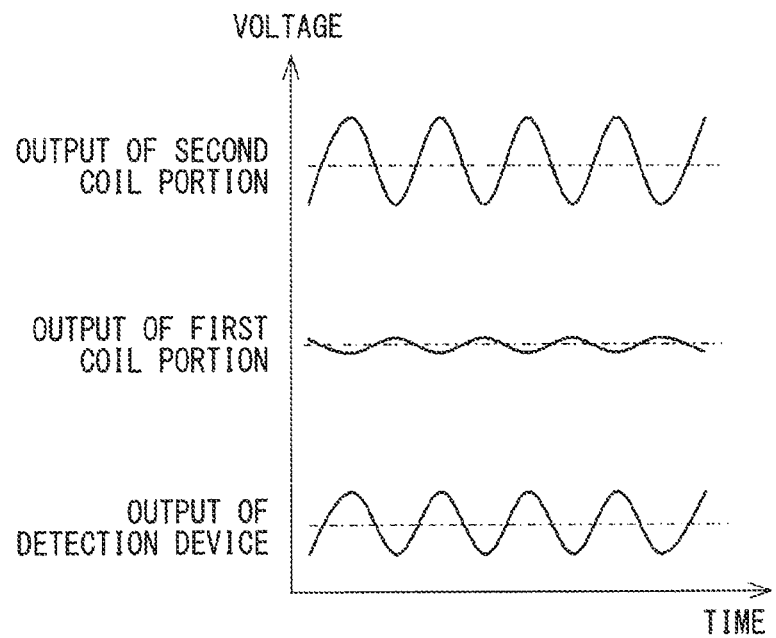
FIGS. 5(A) and 5(B) are analysis diagrams for analyzing detected voltages of the detection device of the first embodiment.

FIG. 5(A) indicates an output voltage of only the first coil portion 41, an output voltage of only the second coil portion 42, and an output voltage of the detection device 1 at the time of detecting the movement of the blades 2 with the detection device 1.

Figure 5B:
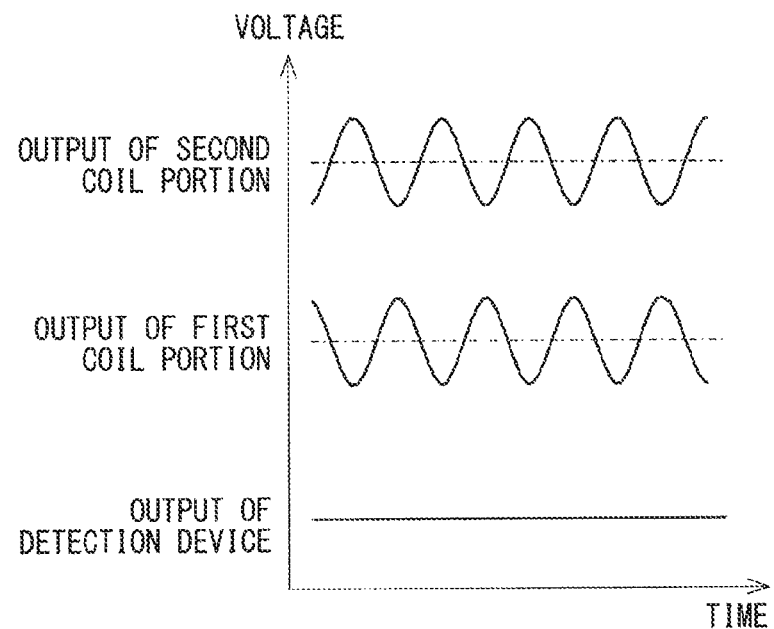

FIG. 5(B) indicates an output voltage of only the first coil portion 41, an output voltage of only the second coil portion 42, and an output voltage of the detection device 1 at the time of applying the disturbance magnetic field to the detection device 1.

As indicated in FIG. 5(A), in the case where the detection device 1 detects the movement of the blades 2, every time the blade 2 passes the detection device 1, the output voltage of the second coil portion 42 is largely changed. In contrast, although the output voltage of the first coil portion 41 is slightly changed, the change in the output voltage of the first coil portion 41 is negligibly small. Therefore, the movement of the blades 2 can be accurately detected based on the output of the detection device 1, in which the first coil portion 41 and the second coil portion 42 are connected in series.

As shown in FIG. 5(B), in the case where the disturbance magnetic field is applied to the detection device 1, the output voltage of the first coil portion 41 and the output voltage of the second coil portion 42 are of identical amplitude and wavelength but opposite phases. Therefore, the output of detection device 1, in which the first coil portion 41 and the second coil portion 42 are connected in series, becomes zero (0). Thus, the movement of the blades 2 can be accurately detected without being influenced by the disturbance magnetic field.

Next, a manufacturing method of the detection device 1 of the first embodiment will be described. More specifically, a winding method of the wire 40 will be described with reference to FIGS. 6, 7 and 8.

First of all, at a first connecting step S100, one end of the wire 40 is connected to the first terminal 31. At this time, as discussed above, the wire 40 is wound around the first terminal 31 at the location, which is on the distal end side of the recessed part 33 where the distal end part of the first terminal 31 is placed. Thereafter, the wire 40 is wound around the recessed part 33 for several turns to form the first dead turn part 432. After the first dead turn part 432 is formed, the wire 40 is moved to the first bobbin 21 while the tension is applied to the wire 40 by contacting the wire 40 against the corner between the notched surface 212 of the flange 211 of the first bobbin 21 and the terminal fixing portion 24.

Then, at a first coil forming step S101, the wire 40 is wound around the first bobbin 21 for, for example, 100 turns to form the first coil portion 41. The first coil portion 41 is formed by rotating the dielectric member 20 about the axis at a high rotational speed to wind the wire 40 around the first bobbin 21.

Figure 8:
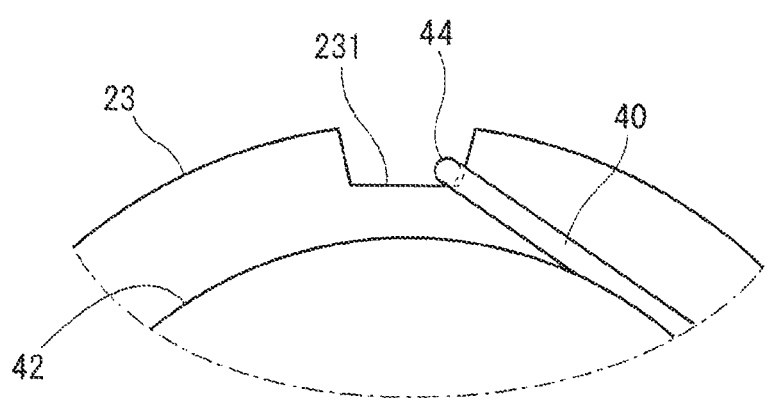
FIG. 8 is a view taken in a direction of an arrow VIII in FIG. 6.

Then, at a first moving step S102, the wire 40 is traversed from the first coil portion 41 to the second bobbin 22 over the holder 23. At this time, the wire 40 is moved to the second bobbin 22 while the tension is applied to the wire 40 by contacting the wire 40 against a wall of a corresponding one of the recessed grooves 231 formed in the outer wall of the holder 23, as shown in FIG. 8.

Next, at a second coil forming step S103, the wire 40 is wound around the second bobbin 22 for, for example, 100 turns, so that the second coil portion 42 is formed. The second coil portion 42 is formed by rotating the dielectric member 20 at the high rotational speed in a opposite rotational direction, which is opposite from the rotational direction of the dielectric member 20 at the time of forming the first coil portion 41, to wind the wire 40 around the second bobbin 22.

Next, at a second moving step S104, the wire 40 is traversed from the second coil portion 42 to the first bobbin 21 over the holder 23. At this time, the wire 40 is moved to the first bobbin 21 while the tension is applied to the wire 40 by contacting the wire 40 against the wall of a corresponding one of recessed grooves 231 formed in the outer wall of the holder 23, as shown in FIG. 8.

Next, at a slack limiting portion forming step S105, the wire 40 is wound around the first bobbin 21 for one to five turns to form the slack limiting portion 46. In this way, loosening of the wire 40 at the outer side of the first coil portion 41 is limited.

Next, at a second connecting step S106, the other end of the wire 40 is connected to the second terminal 32. At this time, the wire 40 is moved to the second terminal 32 while the tension is applied to the wire 40 by contacting the wire 40 against the corner between the notched surface 212 of the flange 211 of the first bobbin 21 and the terminal fixing portion 24. Then, the wire 40 is wound around the recessed part 33 of the second terminal 32 for several turns to form the second dead turn part 472. Then, the wire 40 is wound around the second terminal 32 at the location, which is on the distal end side of the recessed part 33 where the distal end part of the second terminal 32 is placed.

Thereafter, the first fixing part 431 and the second fixing part 471 are formed by generating the electric arc from the distal end part of each of the first terminal 31 and the second terminal 32. Then, the dielectric member 20, around which the wire 40 is wound, is received in the case main body 56 and is fixed at the inside of the case main body 56 by, for example, filling the potting material into the inside of the case main body 56.

The detection device 1 and the manufacturing method thereof according to the first embodiment provide the following advantages.

(1) In the detection device 1 of the first embodiment, the first connecting portion 43, the first coil portion 41, the first crossover portion 44, the second coil portion 42, the second crossover portion 45 and the second connecting portion 47 are formed by the single continuous wire 40.

In this way, the operation of forming the first coil portion 41 and the second coil portion 42 by the wire 40, which is connected to the first terminal 31, and then connecting the wire 40 to the second terminal 32 can be made in the single process. Thus, since a joint is not formed in the wire 40 between the first coil portion 41 and the second coil portion 42, a possibility of breaking the wire 40 can be reduced, and thereby a reliability of the detection device 1 can be improved. Furthermore, the detection device 1 enables simplification of the manufacturing step of winding the wire 40.

(2) In the first embodiment, the holder 23 includes the plurality of recessed grooves 231, which connect between the first bobbin 21 and the second bobbin 22. The first crossover portion 44 of the wire 40 and the second crossover portion 45 of the wire 40 are inserted into the corresponding recessed grooves 231, respectively.

Therefore, the second coil portion 42 can be formed while applying the tension to the wire 40 by traversing the wire 40 from the first coil portion 41 to the second bobbin 22 along the wall of the corresponding recessed groove 231.

Furthermore, the slack limiting portion 46 can be formed while applying the tension to the wire 40 by traversing the wire 40 from the second coil portion 42 to the first coil portion 41 along the wall of the recessed groove 231. Therefore, the detection device 1 can reduce the loosening of the wire 40.

(3) In the first embodiment, the wire 40 includes the slack limiting portion 46, which is wound around the outer side of the first coil portion 41 for at least one turn at the location between the second crossover portion 45 and the second connecting portion 47.

Thereby, with respect to the wire 40, which extends from the second coil portion 42 to the second terminal 32 through the second crossover portion 45 and the first coil portion 41, it is possible to limit the loosening of the wire 40 on the first coil portion 41. Thus, it is possible to limit breaking of the wire 40, which would be caused by, for example, catching of a slack of the wire 40 by another member.

(4) In the first embodiment, the first terminal 31 and the second terminal 32 are placed to be parallel to each other and project from the terminal fixing portion 24 in the perpendicular direction that is perpendicular to the direction, along which the magnetic poles of the magnet 10 are placed one after another.

Thereby, the first terminal 31 and the second terminal 32 project from the terminal fixing portion 24 in the common direction. Thus, the wire 40 can be easily connected to the first terminal 31 and the second terminal 32.

(5) In the first embodiment, the first connecting portion 43 of the wire 40 includes the first fixing part 431, which is fixed to the first terminal 31, and the first dead turn part 432, which is wound around the first terminal 31 on the terminal fixing portion 24 side of the first fixing part 431. Similarly, the second connecting portion 47 includes the second fixing part 471 and the second dead turn part 472.

Thereby, at the time of forming the first coil portion 41 by winding the wire 40 around the first bobbin 21 while applying the tension to the wire 40, the force is applied to the first dead turn part 432. Thus, removal of the wire 40 from the first terminal 31 can be limited.

Furthermore, at the time of forming the second dead turn part 472 by winding the wire 40 around the second terminal 32 while applying the tension to the wire 40, loosening of the wire 40 of the slack limiting portion 46 can be limited, and removal of the wire 40 from the second terminal 32 can be limited.

(5) In the manufacturing method of the detection device 1 according to the first embodiment, the connecting of the wire 40 to the first terminal 31, the forming of the first coil portion 41 with the wire 40, the traversing of the wire 40 over the holder 23, the forming of the second coil portion 42 with the wire 40, the traversing of the wire 40 over the holder 23, and the connecting of the wire 40 to the second terminal 32 can be implemented by the series of continuous steps. Therefore, the joint of the wire 40 is not formed between the first coil portion 41 and the second coil portion 42. As a result, it is possible to limit breaking of the wire 40.

Second Embodiment

Figure 9:
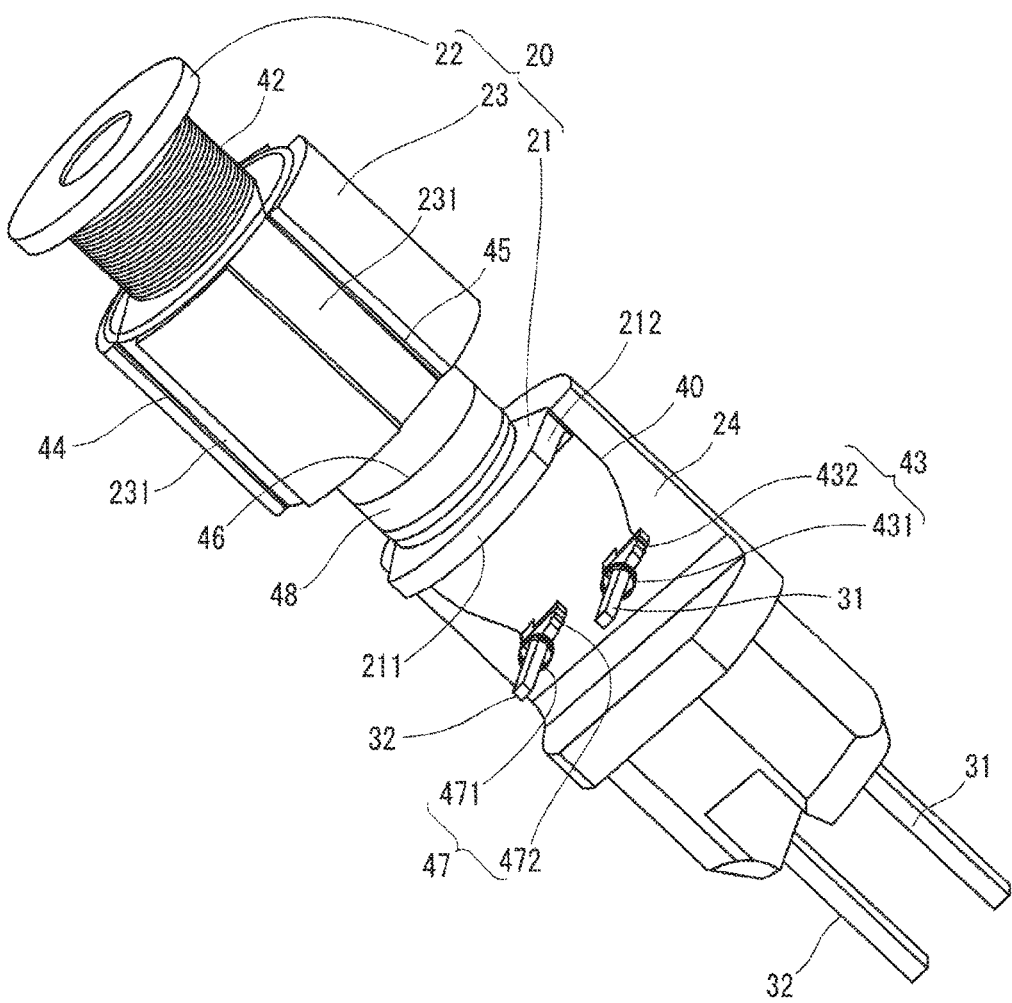
FIG. 9 is a perspective view showing characteristic parts of a detection device according to a second embodiment of the present disclosure.
Figure 10:
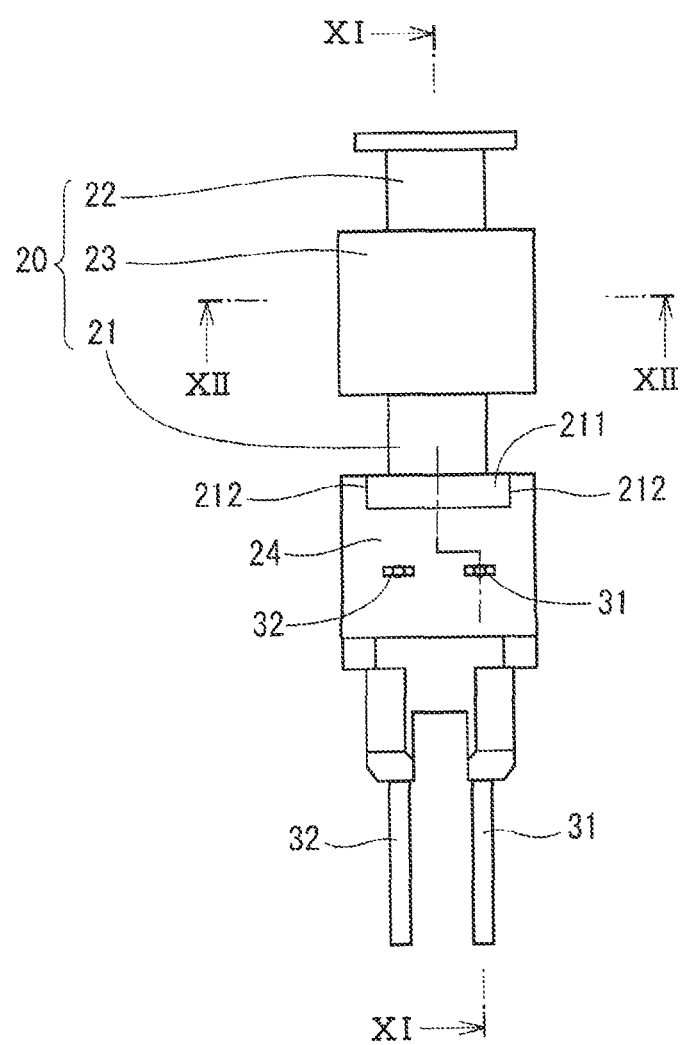
FIG. 10 is a plan view showing characteristic parts of a detection device according to a third embodiment of the present disclosure.
Figure 11:
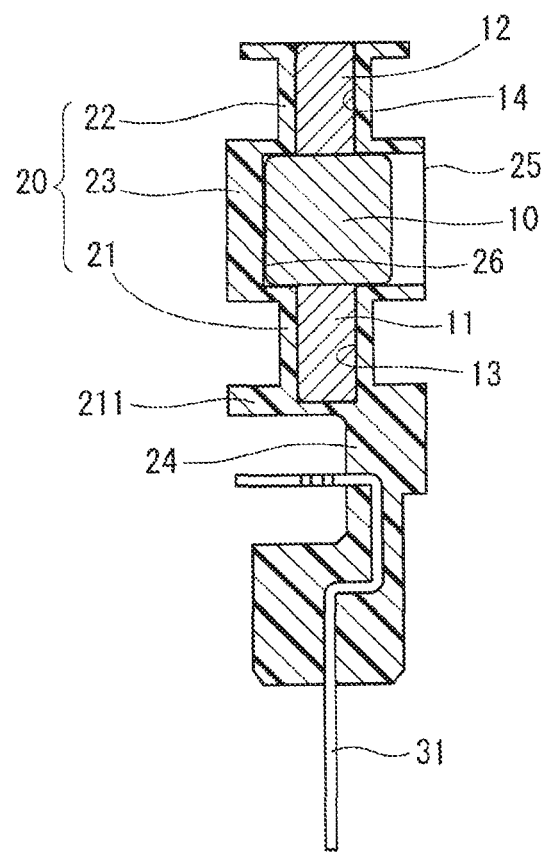
FIG. 11 is a cross sectional view taken along line XI-XI in FIG. 10.
Figure 12:
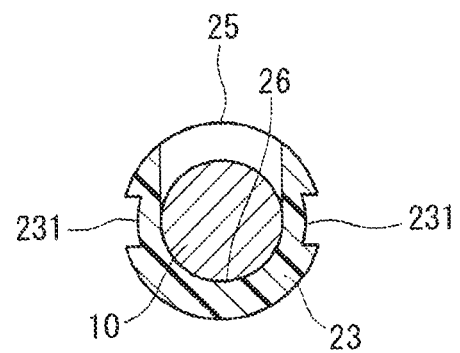
FIG. 12 is a cross sectional view taken along line XII-XII in FIG. 10.

FIG. 9 shows a detection device 1 according to a second embodiment of the present disclosure. In the embodiments discussed below, parts, which are substantially identical to those of the first embodiment, will be indicated by the same reference signs and will not be described redundantly for the sake of simplicity.

In the second embodiment, the detection device 1 includes a dielectric film 48, which is placed between the first coil portion 41 and the slack limiting portion 46. The dielectric film 48 is formed, for example, as follows. The wire 40 is wound around the first bobbin 21, so that the first coil portion 41 is formed. Thereafter, a dielectric tape is wound over the first coil portion 41 to form the dielectric film 48. The wire 40 is wound around the dielectric film 48 for one to five turns to form the slack limiting portion 46.

In the second embodiment, by having the dielectric film 48, the detection device 1 can limit occurrence of short-circuiting between the first coil portion 41 and the slack limiting portion 46.

Third Embodiment

FIGS. 10 to 13 show a detection device 1 according to a third embodiment of the present disclosure. In the third embodiment, the terminal fixing portion 24, the first bobbin 21, the holder 23 and the second bobbin 22 are integrally and seamlessly formed as a one-piece body by injection molding. The holder 23 includes an opening 25 and a holding portion 26. The opening 25 opens in the perpendicular direction that is perpendicular to the direction, along which the magnetic poles of the magnet 10 are placed one after another. The holding portion 26 holds the magnet 10, which is inserted into the holding portion 26 through the opening 25. A receiving hole 13 of the first bobbin 21, which receives the first core 11 the holding portion 26 of the holder 23, and a receiving hole 14 of the second bobbin 22, which receives the second core 12, are communicated with each other.

Figure 13:
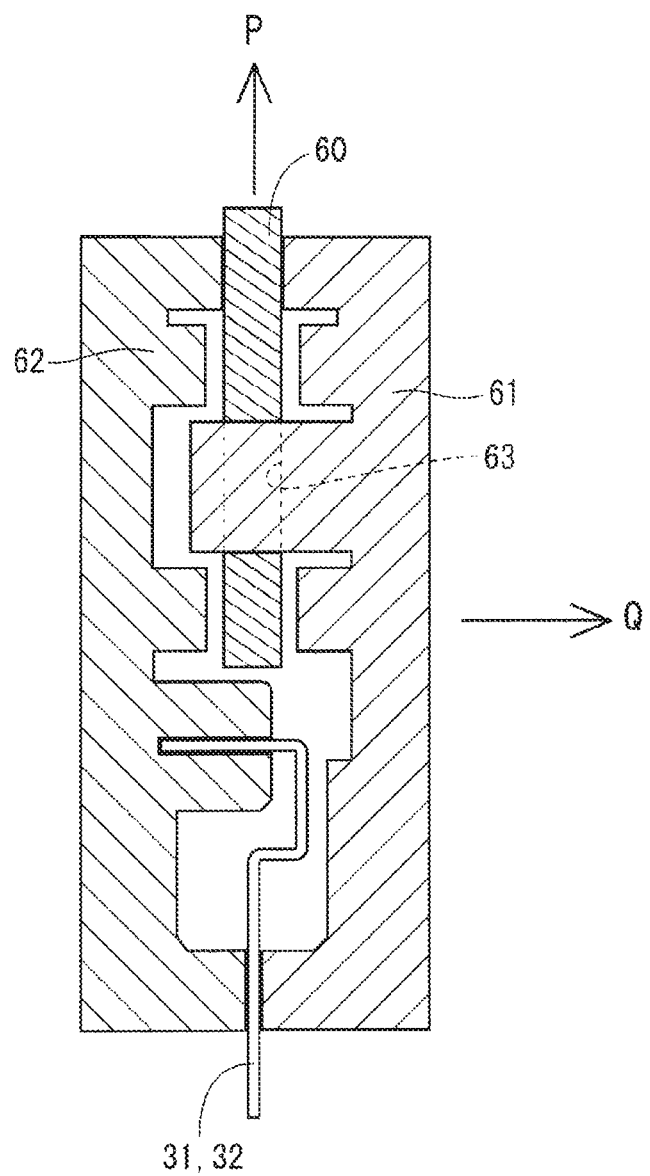
FIG. 13 is a cross sectional view indicating molding dies used in manufacturing of the detection device according to the third embodiment.
Figure 14:
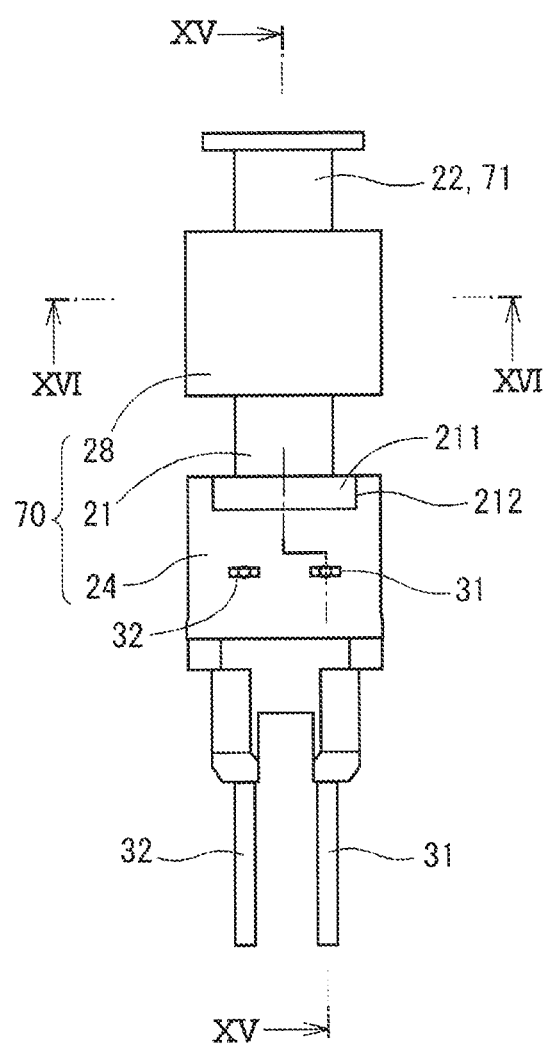
FIG. 14 is a plan view showing characteristic parts of a detection device according to a fourth embodiment of the present disclosure.
Figure 15:
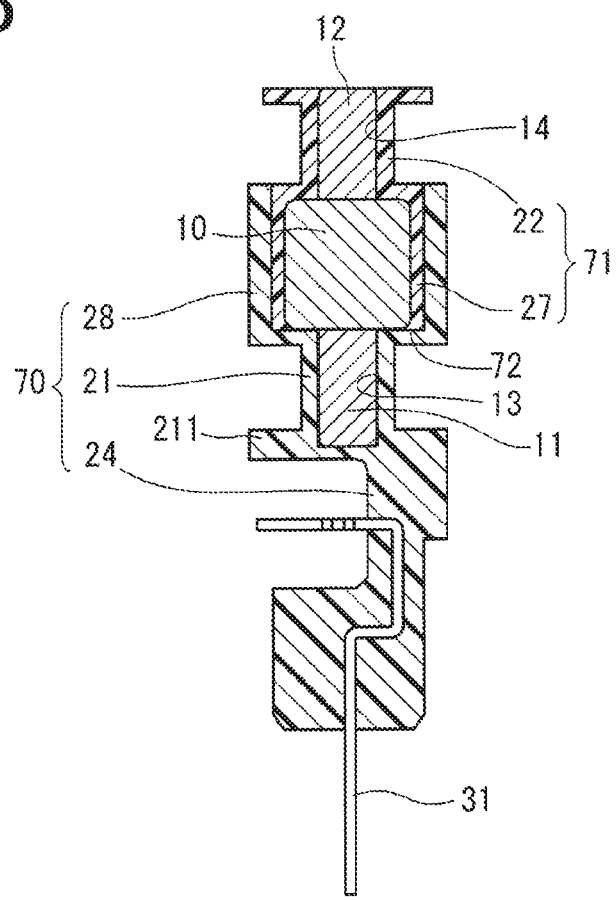
FIG. 15 is a cross sectional view taken along line XV-XV in FIG. 14.
Figure 16:
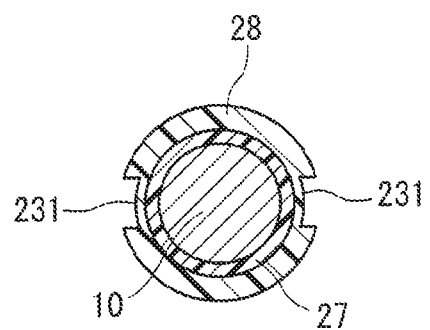
FIG. 16 is a cross sectional view taken along line XVI-XVI in FIG. 14.
Figure 17:
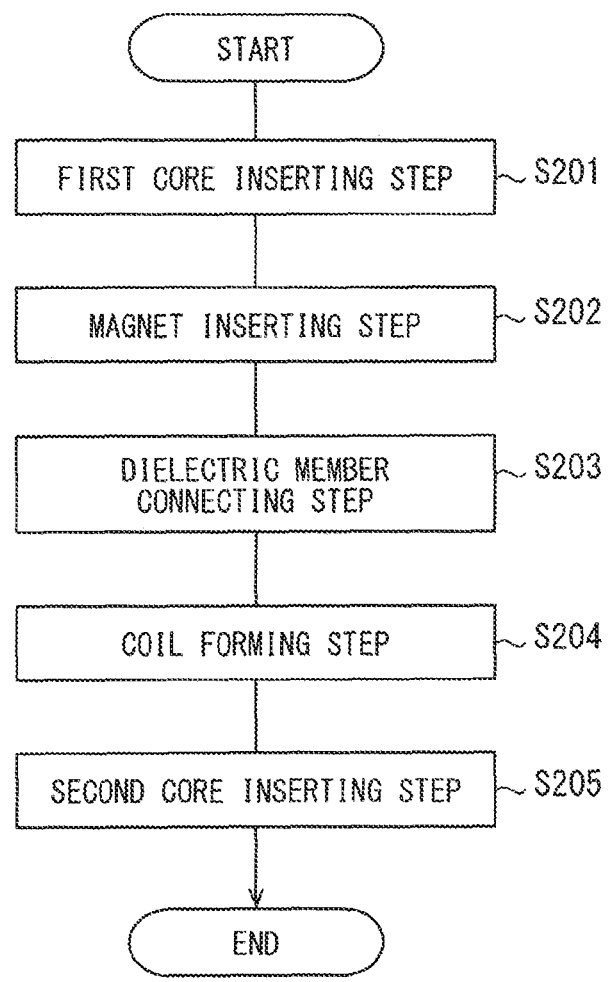
FIG. 17 is a flowchart indicating a manufacturing process of the detection device of the fourth embodiment.

As shown in FIG. 13, the terminal fixing portion 24 and the dielectric member 20 can be injection molded through use of three molding dies 60, 61, 62 of a split type. The molding die 60 is shaped into a cylindrical form and is used for forming the receiving hole 13, which receives the first core 11, and the receiving hole 14, which receives the second core 12. The molding die 60 extends through a hole 63 that is formed in the molding die 61 that forms the opening 25 and the holding portion 26 of the holder 23. Therefore, there are two pulling directions for the molding dies 60, 61, respectively, as indicated by an arrow P and an arrow Q. Thus, in the case of the detection device 1 of the third embodiment, the terminal fixing portion 24 and the dielectric member 20 can be easily manufactured by the injection molding.

In the third embodiment, the dielectric member 20 is integrally and seamlessly formed as the one-piece body, so that the number of components of the detection device 1 can be reduced.

Furthermore, according to the third embodiment, in the dielectric member 20, the receiving holes 13, 14, which receive the first core 11 and the second core 12, respectively, are perpendicular to the opening 25, through which the magnet 10 is inserted. Therefore, the dielectric member 20 can be easily formed by the resin injection modling.

Fourth Embodiment

FIGS. 14 to 17 show a detection device 1 according to a fourth embodiment of the present disclosure. In the fourth embodiment, the magnet 10 is held by a holder, which is formed by two members. The member, which surrounds a radially outer side of the magnet 10, is referred to as an inner holder 27, and the other member, which covers a radially outer side of the inner holder 27, is referred to as an outer holder 28.

In the fourth embodiment, the terminal fixing portion 24, the first bobbin 21 and the outer holder 28 are integrally and seamlessly formed as a one-piece body to form a terminal side dielectric member 70. Furthermore, the second bobbin 22 and the inner holder 27 are integrally and seamlessly formed as a one-piece body to form a detection side dielectric member 71. The terminal side dielectric member 70 and the detection side dielectric member 71 are fixed together by, for example, bonding agent 72. The bonding agent 72 is applied to a first bobbin side end surface of the inner holder 27 and an inner holder side surface of the first bobbin 21.

A manufacturing method of the detection device 1 of the fourth embodiment will now be described.

At a first core inserting step S201, the first core 11 is inserted into the receiving hole 13 of the first bobbin 21 of the terminal side dielectric member 70. Then, at a magnet inserting step S202, the magnet 10 is inserted into the inside of the inner holder 27 of the detection side dielectric member 71.

Thereafter, at a dielectric member connecting step S203, a predetermined amount of bonding agent 72 is applied to the first bobbin side end surface of the inner holder 27, and then the inner holder 27 is inserted into the inside of the outer holder 28. In this way, the terminal side dielectric member 70 and the detection side dielectric member 71 are fixed together. At this time, the magnet 10 and the first core 11 come into contact with each other due to a magnetic attractive force of the magnet 10. Furthermore, an applied location of the bonding agent 72 is distant from the second bobbin 22. Therefore, the bonding agent 72 will not leak into the receiving hole 14 of the second bobbin 22.

Next, at a coil forming step S204, according to the winding method of the wire 40 (steps S100-S106) discussed in the first embodiment, the wire 40 is connected to the first terminal 31 and is wound around the first bobbin 21 and the second bobbin 22 and is thereafter connected to the second terminal 32. At this time, a shaft member (not shown) may be inserted into the receiving hole 14 of the second bobbin 22, into which the second core 12 is inserted later. Then, this shaft member may be used as a rotation shaft, and the dielectric member 20 may be rotated about an axis of the shaft member at a high rotational speed to wind the wire 40 around the first bobbin 21 and the second bobbin 22 of the dielectric member 20.

After the wire 40 is wound around the dielectric member 20, the shaft ember may be removed from the receiving hole 14 of the second bobbin 22.

Next, at a second core inserting step S205, the second core 12 is inserted into the receiving hole 14 of the second bobbin 22. At this time, since the bonding agent 72 is not leaked into the receiving hole 14 of the second bobbin 22, the magnet 10 and the second core 12 come into contact with each other due to the magnetic attractive force of the magnet 10. Thereafter, the dielectric member 20 is received in the case main body 56 and is fixed at the inside of the case main body 56 by, for example, filling the potting material into the inside of the case main body 56.

According to the fourth embodiment, the holder 23 includes the inner holder 27, which surrounds the radially outer side of the magnet 10, and the outer holder 28, which covers the radially outer side of the inner holder 27. The dielectric member 20 includes the terminal side dielectric member 70, in which the first bobbin 21 and the outer holder 28 are integrally and seamlessly formed as the one-piece body, and the detection side dielectric member 71, in which the second bobbin 22 and the inner holder 27 are integrally and seamlessly formed as the one-piece body.

In this way, the dielectric member 20 can receive the magnet 10 without forming the opening 25 described in the third embodiment.

Furthermore, according to the fourth embodiment, the terminal side dielectric member 70 and the detection side dielectric member 71 are fixed together by the bonding agent 72 that is applied between the first bobbin side end surface of the inner holder 27 and the inner holder side surface of the first bobbin 21.

In this way, the leakage of the bonding agent 72 into the receiving hole 14 of the second bobbin 22 can be limited. Thus, at the time of inserting the second core 12 into the receiving hole 14 of the second bobbin 22, the magnet 10 and the second core 12 can come into contact with each other without being interfered by the bonding agent 72. Therefore, the detection device 1 can improve the reliability with respect to the detection accuracy thereof.

Furthermore, since the recessed grooves 231 are located at the terminal side, the positioning of the outer holder 28 and the inner holder 27 is not required.

Fifth Embodiment

Figure 18:
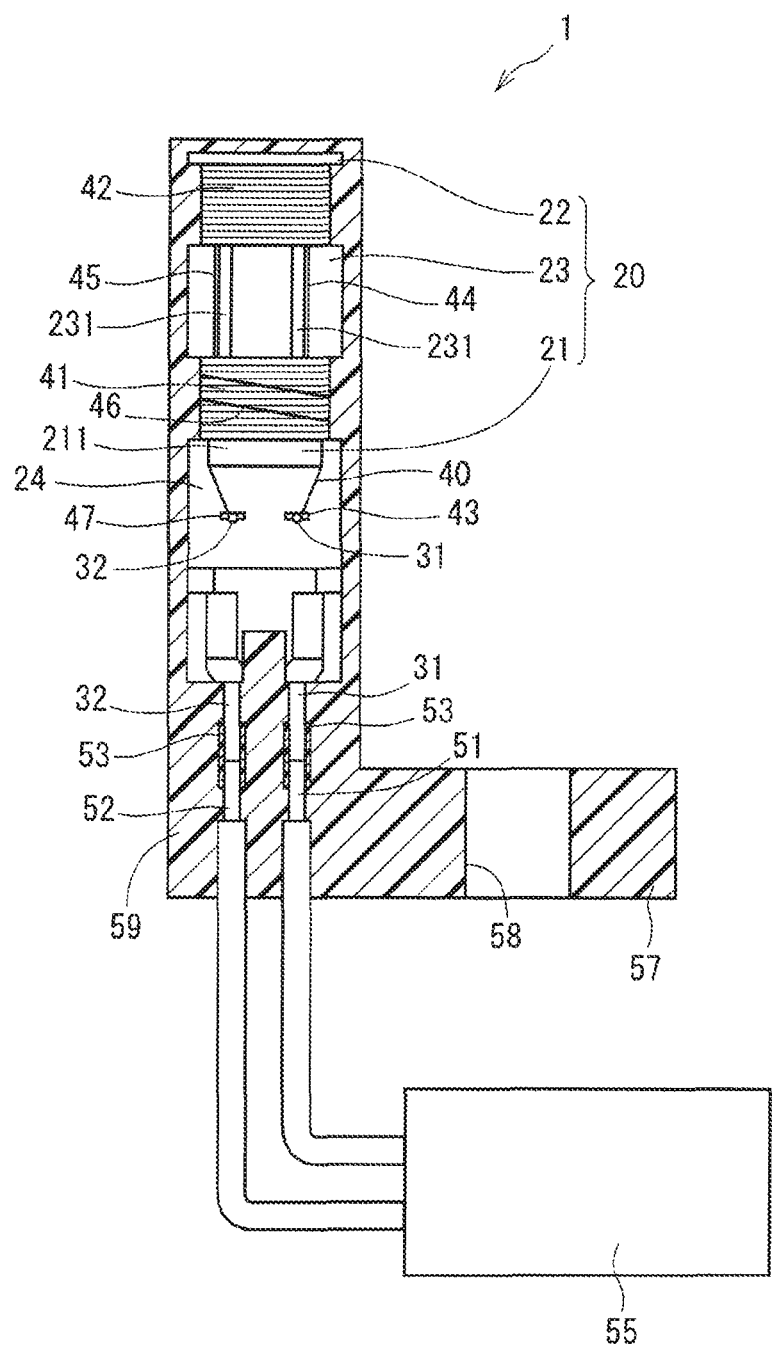
FIG. 18 is a cross sectional view of a detection device according to a fifth embodiment of the present disclosure.

FIG. 18 shows a detection device 1 according to a fifth embodiment of the present disclosure. In the fifth embodiment, the dielectric member 20, around which the wire 40 is wound, is resin molded to form an outer shell 59 thereof.

Sixth Embodiment

FIGS. 19 to 25 show a detection device 1 according to a sixth embodiment of the present disclosure. The sixth embodiment is suitable for a case where a thermal expansion coefficient of the dielectric member 20 and a thermal expansion coefficient of the wire 40 are substantially different from each other.

Figure 20:
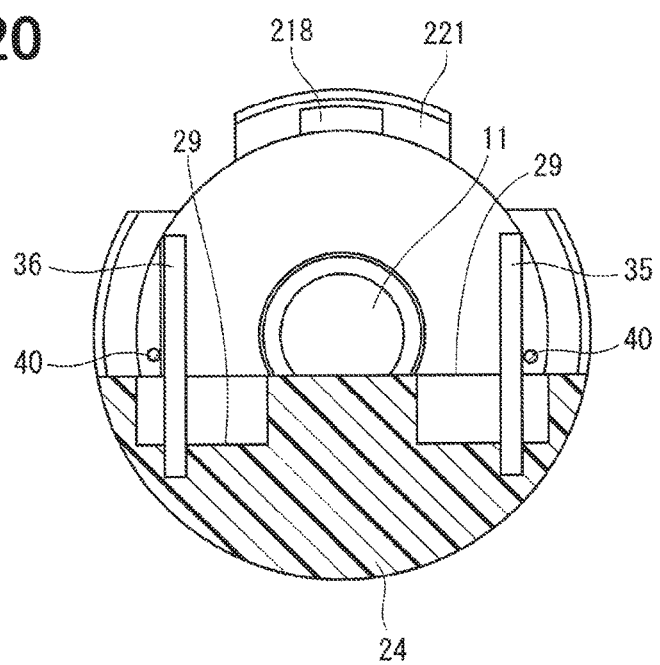
FIG. 20 is a cross sectional view taken along line XX-XX in FIG. 19.
Figure 21:
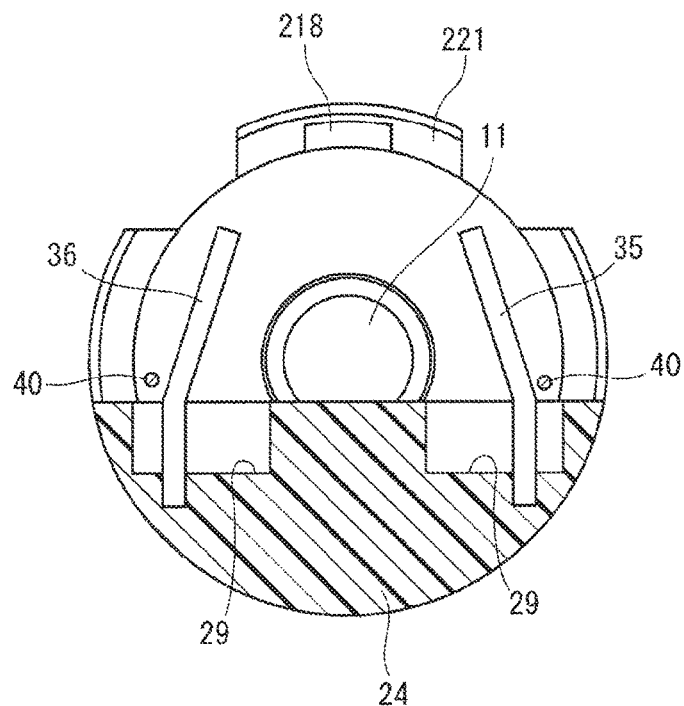
FIG. 21 is a cross sectional view indicating a state where a wire and an adjusting member do not contact with each other.

As shown in FIGS. 19 to 21, in the sixth embodiment, the detection device 1 includes a first adjusting member 35 and a second adjusting member 36, which project from the terminal fixing portion 24 in the perpendicular direction that is perpendicular to the direction, along which the magnetic poles of the magnet 10 are placed one after another.

The first adjusting member 35 is fixed to the terminal fixing portion 24 at a location that is on a radially outer side of an imaginary straight line L1, which connects between the notched surface 212 of the flange 211 of the first bobbin 21 and the first terminal 31. That is, the first adjusting member 35 is placed at a contact location, at which the wire 40 contacts the first adjusting member 35 when the wire 40 is moved from the first terminal 31 to the first bobbin 21.

The terminal fixing portion 24 includes a recess 29 at the location where the first adjusting member 35 projects. The first adjusting member 35 projects from a bottom of the recess 29. The first adjusting member 35 and the first terminal 31 are joined together in the inside of the terminal fixing portion 24 and are integrally and seamlessly formed as a one-piece body.

Also, the second adjusting member 36 is fixed to the terminal fixing portion 24 at a location that is on a radially outer side of an imaginary straight line L2, which connects between the notched surface 212 of the flange 211 of the first bobbin 21 and the second terminal 32. That is, the second adjusting member 36 is placed at a contact location, at which the wire 40 contacts the second adjusting member 36 when the wire 40 is moved from slack limiting portion 46 to the second terminal 32 after the second coil forming step S103.

The second adjusting member 36 projects from a bottom of another recess 29 formed in the terminal fixing portion 24. The second adjusting member 36 and the second terminal 32 are joined together in the inside of the terminal fixing portion 24 and are integrally and seamlessly formed as a one-piece body.

Figure 22:
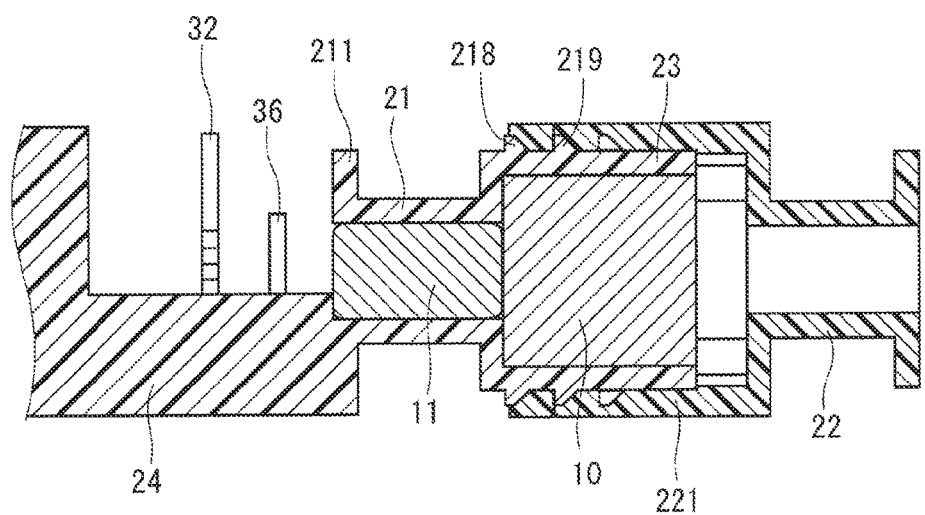
FIG. 22 is a cross sectional view showing characteristic parts of the detection device of the sixth embodiment.
Figure 23:
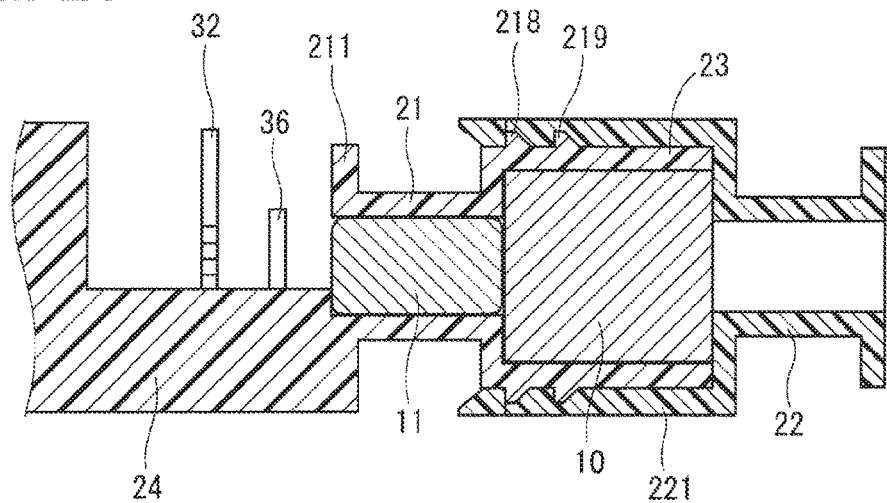
FIG. 23 is another cross sectional view showing the characteristic parts of the detection device of the sixth embodiment.
Figure 24:
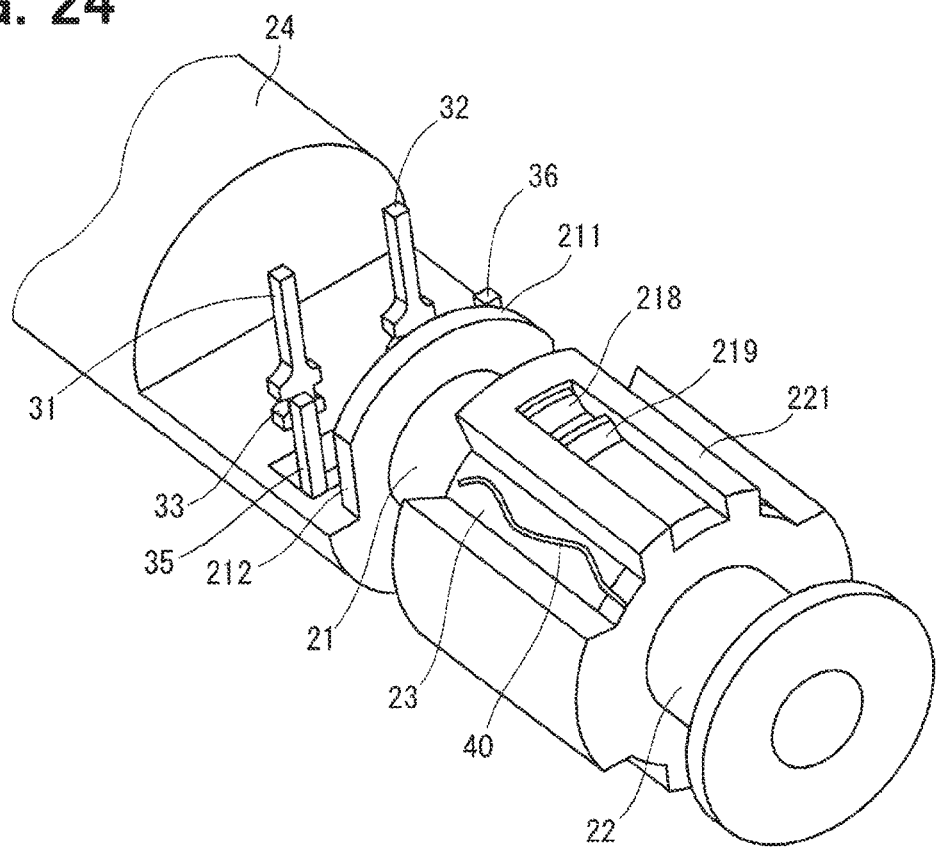
FIG. 24 is a perspective view showing the characteristic parts of the detection device of the sixth embodiment.

Furthermore, as shown in FIGS. 22 to 24, according to the sixth embodiment, the magnet 10 is held by the holder 23 that extends from an end part of the first bobbin 21 and is shaped into a tubular form. Arms 221, which extend from an end part of the second bobbin 22, cover a radially outer side of the holder 23. The first bobbin 21 and the second bobbin 22 can move relative to each other in the direction, along which the magnetic poles of the magnet 10 are placed one after another. The first bobbin 21 and the second bobbin 22 are positioned relative to each other when each of the arms 221, which extend from the second bobbin 22, are fitted to corresponding projections 218, 219, which are formed at the radially outer side of the holder 23. The two projections 218, 219 are arranged one after another in the direction, along which the magnetic poles of the magnet 10 are placed one after another. Therefore, the first bobbin 21 and the second bobbin 22 can be positioned relatively to each other in two steps in the direction, along which the magnetic poles of the magnet 10 are placed one after another. The projection, which is located on the first bobbin 21 side, is referred to as a first projection 218, and the projection, which is located on the second bobbin 22 side, is referred to as a second projection 219.

Figure 25:
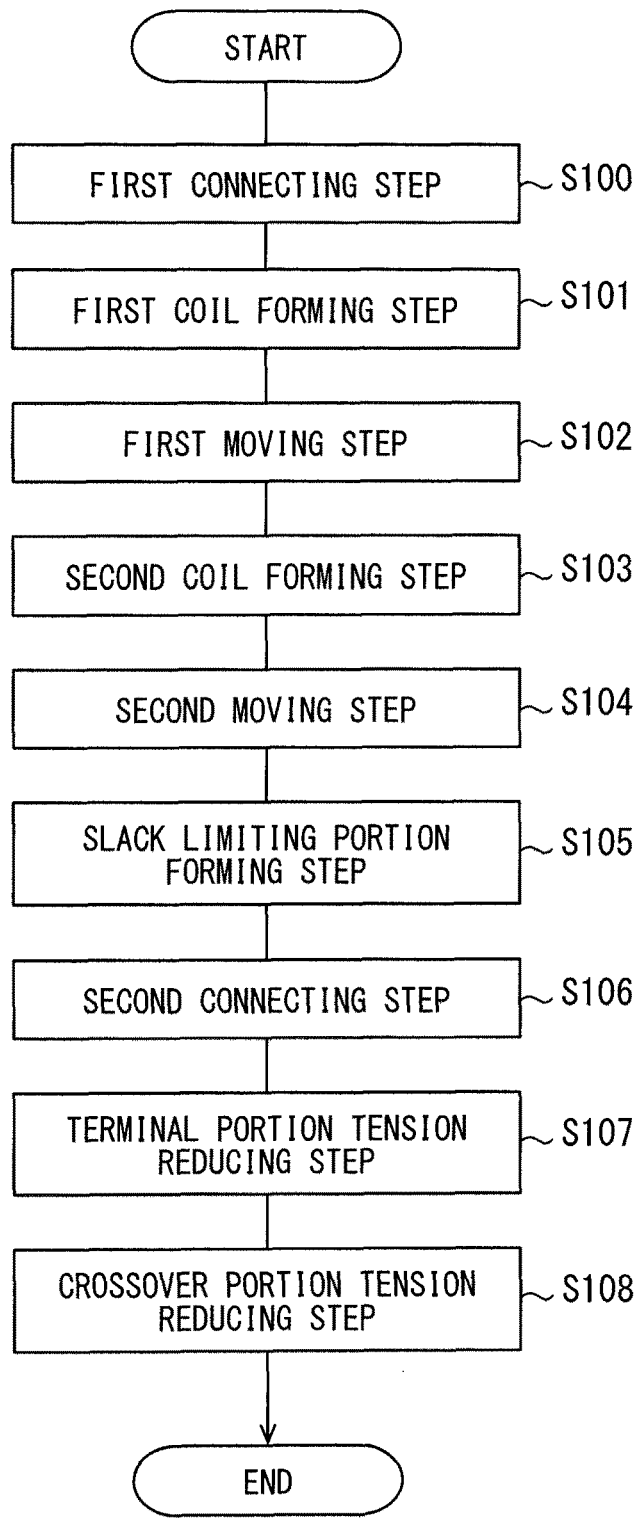
FIG. 25 is a flowchart indicating a manufacturing process of the detection device of the sixth embodiment.

Now, a winding method of the wire 40 of the detection device 1 of the sixth embodiment will be described with reference to FIGS. 19 to 24 and a flowchart of FIG. 25.

As shown in FIGS. 19 and 20, at the first connecting step S100, one end of the wire 40 is connected to the first terminal 31, and thereafter the wire 40 is moved to the first bobbin 21 while the wire 40 is kept in contact with the first adjusting member 35.

The first coil forming step S101 to the slack limiting portion forming step S105 are the same as those discussed in the first embodiment. As shown in FIG. 22, the winding process for winding the wire 40 around the first bobbin 21 and the second bobbin 22 is executed in the state where each arm 221 is engaged with the second projection 219. Therefore, according the winding method of the wire 40 of the sixth embodiment, in the state where the second bobbin 22 side end part of the holder 23 is spaced from the magnet 10 side end part of the second bobbin 22, the dielectric member 20 is rotated about the axis at the high rotational speed, and thereby the wire 40 is wound around the first bobbin 21 and the second bobbin 22.

After the execution of the slack limiting portion forming step S105, the operation proceeds to the second connecting step S106. At the second connecting step S106, the wire 40 is moved to the second terminal 32 while the wire 40 is kept in contact with the second adjusting member 36.

Next, as shown in FIG. 21, at a terminal portion tension reducing step S107, the first adjusting member 35 and the second adjusting member 36 are radially inwardly bent. Thereby, the first adjusting member 35 and the wire 40 are out of contact with each other, and the second adjusting member 36 and the wire 40 are out of contact with each other.

The first adjusting member 35 and the second adjusting member 36 are respectively fixed to the bottoms of the recesses 29, which are formed in the terminal fixing portion 24. The bottom of each recess 29 is spaced from the corresponding contact location, at which the corresponding one of the first adjusting member 35 and the second adjusting member 36 contacts the wire 40 at the time of executing the second connecting step S106. Therefore, when each of the first adjusting member 35 and the second adjusting member 36 is bent about the bottom of the corresponding recess 29, the portion of each of the first adjusting member 35 and the second adjusting member 36, which contacts the wire 40, is moved away from the wire 40. In this way, the portion of the wire 40, which is located between the first terminal 31 and the first bobbin 21, is loosen, and thereby the tension of this portion of the wire 40 is reduced. Furthermore, the portion of the wire 40, which is located between the second terminal 32 and the first bobbin 21, is loosen, and thereby the tension of this portion of the wire 40 is reduced.

Next, as shown in FIGS. 23 and 24, at a crossover portion tension reducing step S108, a distance between the first bobbin 21 and the second bobbin 22 is reduced. In this way, the magnet 10 side end part of the second bobbin 22 and the magnet 10 contact with each other. Furthermore, the magnet 10 side end part of the second bobbin 22 and the second bobbin 22 side end part of the holder 23 come into contact with each other. In this way, the portion of the wire 40, which forms the first crossover portion 44, and the portion of the wire 40, which forms the second crossover portion 45, are loosen between the first bobbin 21 and the second bobbin 22. Thereby, the tension of each of these portions of the wire 40 is reduced.

The detection device 1 and the manufacturing method thereof according to the sixth embodiment provide the following advantages.

(1) In the detection device 1 of the sixth embodiment, the first terminal 31 and the first adjusting member 35 are integrally and seamlessly formed as the one-piece body, and the second terminal 32 and the second adjusting member 36 are integrally and seamlessly formed as the one-piece body.

Thereby, it is possible to limit an increase in the number of components.

(2) In the sixth embodiment, the first adjusting member 35 is fixed to the terminal fixing portion 24 at the location that is spaced from the contact location, at which the first adjusting member 35 and the wire 40 contact with each other at the time of executing the first coil forming step S101.

Furthermore, the second adjusting member 36 is fixed to the terminal fixing portion 24 at the location that is spaced from the contact location, at which the second adjusting member 36 and the wire 40 contact with each other at the time of executing the second connecting step S106.

Thereby, the first adjusting member 35 and the second adjusting member 36 can be easily brought out of contact with the wire 40 by bending the first adjusting member 35 and the second adjusting member 36 at the locations, at which the first adjusting member 35 and the second adjusting member 36 are respectively fixed to the terminal fixing portion 24, at the terminal portion tension reducing step 107.

(3) The manufacturing method of the detection device 1 of the sixth embodiment includes the terminal portion tension reducing step 107, in which the first adjusting member 35 is brought out of contact with the wire 40, and the second adjusting member 36 is brought out of contact with the wire 40.

Thereby, the tension of the portion of the wire 40, which is located between the first connecting portion 43 and the first coil portion 41, can be reduced, and the tension of the portion of the wire 40, which is located between the second connecting portion 47 and the slack limiting portion 46, can be reduced. Therefore, even in the case where the thermal expansion coefficient of the dielectric member 20 and the thermal expansion coefficient of the wire 40 are substantially different from each other, the possibility of breaking the wire 40 by, for example, a thermal shock can be reduced.

(4) The manufacturing method of the detection device 1 of the sixth embodiment includes the crossover portion tension reducing step S108, in which the tension of the portion of the wire 40, which forms the first crossover portion 44, and the tension of the portion of the wire 40, which forms the second crossover portion 45, are reduced by reducing the distance between the first bobbin 21 and the second bobbin 22.

Thereby, the tension of the portion of the wire 40, which forms the first crossover portion 44, and the tension of the portion of the wire 40, which forms the second crossover portion 45, can be reduced. Therefore, even in the case where the thermal expansion coefficient of the dielectric member 20 and the thermal expansion coefficient of the wire 40 are substantially different from each other, the possibility of breaking the wire 40 by, for example, a thermal shock is reduced. Therefore, the reliability of the detection device 1 can be improved.

Seventh Embodiment

Figure 26:
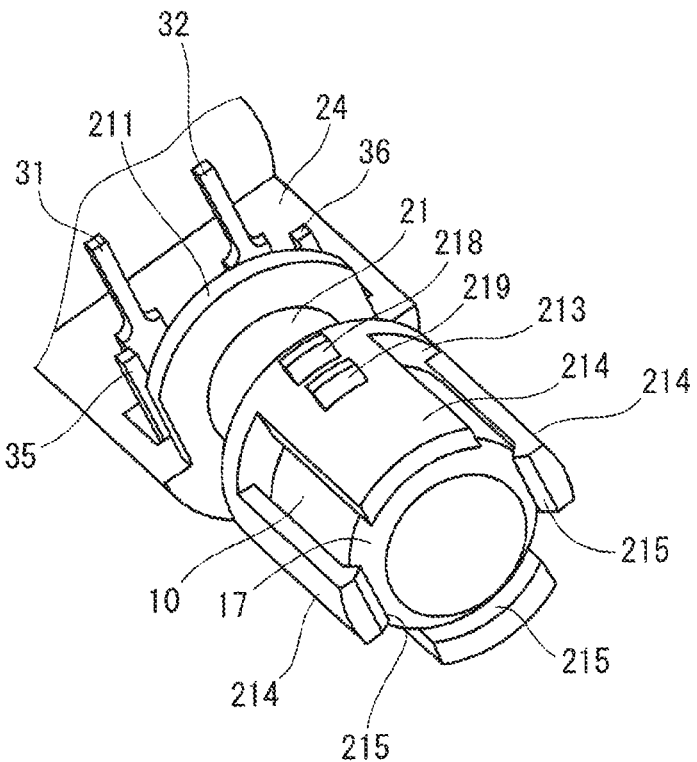
FIG. 26 is a perspective view showing characteristic parts of a detection device according to a seventh embodiment of the present disclosure.
Figure 27:
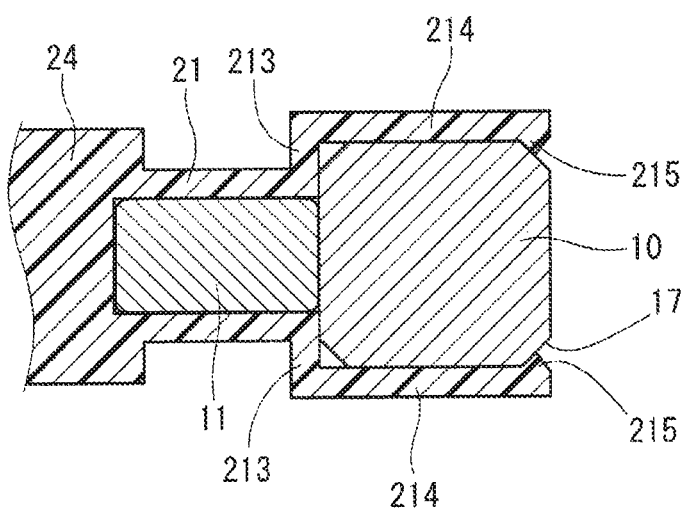
FIG. 27 is a cross sectional view showing the characteristic parts of the detection device of the seventh embodiment.

FIGS. 26 and 27 show a detection device 1 according to a seventh embodiment of the present disclosure. In the seventh embodiment, a plurality of anchoring arms 214 projects from an outer peripheral edge of the flange 213 of the first bobbin 21, which is located on the magnet 10 side. A claw 215 is formed at a radially inner side of a distal end part of each of the anchoring arms 214. The magnet 10 has a tapered portion 17, which is formed by tapering an outer peripheral edge of an axial end part of the magnet 10. The claws 215, which are formed at the distal end parts of the anchoring arms 214 are securely fitted to the tapered portion 17 of the magnet 10. In this way, the magnet 10 is secured to the first bobbin 21.

According to the seventh embodiment, the magnet 10 can be secured to the first bobbin 21 without using the bonding agent.

Other Embodiments (1) In the above-described embodiments, there is described the detection device 1 that detects the rotational speed of the detection subject, which is for example, the blades 2. Alternatively, the detection device 1 can detect movement of various other detection subjects, which are made of a non-magnetic electric conductive material.

(2) In the above-described embodiments, the winding direction of the first coil portion 41 and the winding direction of the second coil portion 42 are opposite to each other, and the portion of the wire 40, which extends from the first coil portion 41 on the magnet 10 side, and the portion of the wire 40, which extends from the second coil portion 42 on the magnet 10 side, are continuously formed.

Alternatively, in another embodiment, the winding direction of the first coil portion 41 and the winding direction of the second coil portion 42 may be opposite to each other, and a portion of the wire 40, which extends from the first coil portion 41 on the side opposite from the magnet 10, and a portion of the wire 40, which extends from the second coil portion 42 on the side opposite from the magnet 10, may be continuously formed. Even with this construction, the detection device 1 can cancel the influence of the disturbance magnetic field.

Further alternatively, in another embodiment, the winding direction of the first coil portion 41 and the winding direction of the second coil portion 42 may be identical to each other, and the portion of the wire 40, which extends from the first coil portion 41 on the magnet 10 side, and the portion of the wire 40, which extends from the second coil portion 42 on the side opposite from the magnet 10, may be continuously formed. Even with this construction, the detection device 1 can cancel the influence of the disturbance magnetic field.

(3) In the above-described embodiments, the first core 11 and the second core 12 are received in the receiving hole 13 of the first bobbin 21 and the receiving hole 14 of the second bobbin 22, respectively, and the magnet 10 is received in the holder 23. Alternatively, in another embodiment, the first core 11, the magnet 10 and the second core 12 may be resin molded at the time of forming the first bobbin 21, the holder 23 and the second core 12 by the injection molding.

As described above, the present disclosure is not limited to the above-described embodiments. In addition of combining any ones or more of the above-described embodiments, the above-described embodiments may be further modified within the scope of the present disclosure.

The invention claimed is:

1. A detection device comprising:
    a magnet;
    a first core that is located on one side of the magnet where one magnetic pole of the magnet is placed;
    a second core that is located on another side of the magnet where another magnetic pole of the magnet is placed;
    a dielectric member that includes:
        a first bobbin, which is located on a radially outer side of the first core;
        a holder, which receives the magnet; and
        a second bobbin, which is located on a radially outer side of the second core;
    a terminal fixing portion that is located on a side of the first bobbin, which is opposite from the magnet;
    a first terminal and a second terminal that are fixed to the terminal fixing portion; and
    a wire that continuously forms:
        a first connecting portion, which is connected to the first terminal;
        a first coil portion, which extends from the first connecting portion and is wound around the first bobbin;
        a first crossover portion, which extends from the first coil portion to the second bobbin across the holder;
        a second coil portion, which extends from the first crossover portion and is wound around the second bobbin in a winding direction, which is opposite from a winding direction of the first coil portion;
        a second crossover portion, which extends from the second coil portion to the first coil portion across the holder; and
        a second connecting portion, which extends from the second crossover portion and is connected to the second terminal.

2. The detection device according to claim 1, wherein:
    the holder includes at least one recessed groove that communicates between the first bobbin and the second bobbin; and
    each of the first crossover portion and the second crossover portion of the wire is received through a corresponding one of the at least one recessed groove of the holder.

3. The detection device according to claim 1, wherein the wire includes a slack limiting portion that is wound around an outer side of the first coil portion for at least one turn at a location between the second crossover portion and the second connecting portion.

4. The detection device according to claim 3, comprising a dielectric film that is placed between the first coil portion and the slack limiting portion.

5. The detection device according to claim 1, wherein the first terminal and the second terminal are placed to be parallel to each other and project from the terminal fixing portion in a direction that is perpendicular to a direction, along which the one magnetic pole and the another magnetic pole of the magnet are placed one after another.

6. The detection device according to claim 1, wherein:
    the first connecting portion of the wire includes:
        a first fixing part, which is fixed to the first terminal; and
        a first dead turn part, which is wound around the first terminal on a side of the first fixing part where the terminal fixing portion is placed;
    the second connecting portion of the wire includes:
        a second fixing part, which is fixed to the second terminal; and
        a second dead turn part, which is wound around the second terminal on a side of the second fixing part wherein the terminal fixing portion is placed.

7. The detection device according to claim 1, wherein:
    the terminal fixing portion, the first bobbin, the holder, and the second bobbin are integrally and seamlessly formed; and
    the holder includes:
        an opening that opens in a direction that is perpendicular to a direction, along which the one magnetic pole and the another magnetic pole of the magnet are placed one after another; and
        a holding portion that holds the magnet inserted from the opening.

8. The detection device according to claim 1, wherein:
    the holder includes:
        an inner holder that surrounds a radially outer side of the magnet; and
        an outer holder that covers a radially outer side of the inner holder; and
    the dielectric member includes:
        a terminal side dielectric member, in which the first bobbin and the outer holder are integrally and seamlessly formed as a one-piece body; and
        a detection side dielectric member, in which the second bobbin and the inner holder are integrally and seamlessly formed as a one-piece body.

9. The detection device according to claim 8, wherein the terminal side dielectric member and the detection side dielectric member are fixed together with a bonding agent that is applied between an end surface of the inner holder, which is located on a side where the first bobbin is placed, and a surface of the first bobbin, which is located on a side where the inner holder is placed.

10. The detection device according to claim 1, comprising:
    a first adjusting member that is located on a radially outer side of an imaginary straight line, which connects between the first terminal and a flange of the first bobbin; and
    a second adjusting member that is located on a radially outer side of an imaginary straight line, which connects between the second terminal and the flange of the first bobbin.

11. The detection device according to claim 10, wherein:
    the first terminal and the first adjusting member are integrally and seamlessly formed as a one-piece body; and
    the second terminal and the second adjusting member are integrally and seamlessly formed as a one-piece body.

12. The detection device according to claim 10, wherein each of the first adjusting member and the second adjusting member is fixed to a bottom of a corresponding recess, which is formed in the terminal fixing portion.

13. A manufacturing method of the detection device of claim 1, comprising:
- a first connecting step of connecting one end of the wire to the first terminal;
- a first coil forming step of forming the first coil portion by winding the wire around the first bobbin after the first connecting step;
- a first moving step of moving the wire to the second bobbin through the holder after the first coil forming step;
- a second coil forming step of forming the second coil portion by winding the wire around the second bobbin after the first moving step;
- a second moving step of moving the wire to the second terminal side through the holder after the second coil forming step; and
- a second connecting step of connecting another end of the wire to the second terminal after the second moving step.

14. A manufacturing method of the detection device of claim 10, comprising:
- a first connecting step of connecting one end of the wire to the first terminal;
- a first coil forming step of forming the first coil portion by winding the wire around the first bobbin while contacting the wire to the first adjusting member after the first connecting step;
- a first moving step of moving the wire to the second bobbin through the holder after the first coil forming step;
- a second coil forming step of forming the second coil portion by winding the wire around the second bobbin after the first moving step;
- a second moving step of moving the wire to the second terminal side through the holder after the second coil forming step;
- a second connecting step of connecting another end of the wire to the second terminal while contacting the wire to the second adjusting member after the second moving step; and
- a terminal portion tension reducing step of disconnecting between the first adjusting member and the wire and disconnecting between the second adjusting member and the wire after the second connecting step.

15. The manufacturing method according to claim 14, wherein:
- the first bobbin and the second bobbin are movable relative to each other in a direction, along which the one magnetic pole and the another magnetic pole of the magnet are placed one after another; and
- the manufacturing method comprising a crossover portion tension reducing step of reducing tensions of the first crossover portion and of the second crossover portion of the wire by reducing a distance between the first bobbin and the second bobbin after the second connecting step.

* * * * *